(12) United States Patent
Lazarev

(10) Patent No.: US 7,211,824 B2
(45) Date of Patent: May 1, 2007

(54) ORGANIC SEMICONDUCTOR DIODE

(75) Inventor: Pavel I. Lazarev, Belmont, CA (US)

(73) Assignee: Nitto Denko Corporation, Osaka (JP)

( * ) Notice: Subject to any disclaimer, the term of this patent is extended or adjusted under 35 U.S.C. 154(b) by 70 days.

(21) Appl. No.: 10/952,393

(22) Filed: Sep. 27, 2004

(65) Prior Publication Data
US 2006/0065888 A1    Mar. 30, 2006

(51) Int. Cl.
H01L 29/47 (2006.01)
H01L 51/30 (2006.01)

(52) U.S. Cl. ............................. 257/40; 257/485
(58) Field of Classification Search ............ 257/40, 257/64, 485
See application file for complete search history.

(56) References Cited

U.S. PATENT DOCUMENTS

| 5,672,904 | A | 9/1997 | Miyata et al. |
| 5,686,753 | A | 11/1997 | Miyata et al. |
| 6,177,712 | B1 | 1/2001 | Miyasaka |
| 2003/0001494 | A1 | 1/2003 | Wakimoto et al. |

FOREIGN PATENT DOCUMENTS

| EP | 0 762 512 A1 | 3/1997 |
| EP | 1 246 271 A2 | 10/2002 |

OTHER PUBLICATIONS

Boudou, L., et al., "Influence of annealing treatment on the electrical conductivity of low density polyethylene", *Polym. Int.*, Society of Chemical Industry, 2001, 50:1046-1049.
Kažukauskas, V., et al., "Trap levels and effect of oxygen in poly[2-methoxy-5-(2'-ethyl-hexyloxy)-1,4-phenylene vinylene] diodes", *Applied Physics Letters*, American institute of Physics, Mar. 18, 2002, 80(11):2017-2019.

(Continued)

*Primary Examiner*—Evan Pert
(74) *Attorney, Agent, or Firm*—Dorsey & Whitney LLP

(57) ABSTRACT

The present invention relates to organic semiconductor diodes, in particular, to the diodes with nonlinear current-voltage characteristics, which are used for power switching, rectifying variable signals, and frequency mixing. The organic semiconductor diode with the p-n junction comprises an anode, cathode, a hole transport layer in contact with the anode, and an electron transport layer in contact with the cathode, and two transport layers being in contact with each other. Another aspect of the present invention is a Schottky barrier diode comprising anode, cathode, and an organic semiconductor layer, wherein the semiconductor layer is either hole or electron transport layer. At least one of the transport layers is characterized by a globally ordered crystalline structure with intermolecular spacing of 3.4±0.3 Å in the direction of one crystal axis. One more aspect of the present invention is a method for obtaining an organic semiconductor layer with the electron-hole type of conductivity.

23 Claims, 3 Drawing Sheets

OTHER PUBLICATIONS

Lazarev, P., "Thin Crystal Film Retarders", Proceeding of the 7th International Display Workshops, Materials and Components, Kobe, Japan, Nov. 29-Dec. 1, 2000, pp. 1159-1160.

Lehn, J., *Supramolecular Chemistry: Concepts and Perspectives*, Wiley, John & Sons, Inc., New York, 1999.

Lous, E.J., et al., "Schottky contacts on highly doped organic semiconductor", *Physical Review B.*, The American Physical Society, Jun. 15, 1995, 51(23):17252-17254.

Meijer, E.J., et al., "Frequency behavior and the Mott-Schottky analysis in poly(3-hexyl thiophene) metal-insulator-semiconductor diodes", *Applied Physics Letters*, American Institute of Physics, Jun. 11, 2001, 78(24): 3902-3904.

Narasimhan, M., et al., "Junction devices based on sulfonated polyaniline", *Applied Physics Letters*, American Institute of Physics, Mar. 2, 1998, 72(9): 1063-1065.

Roman, L.S., et al., "Charge carrier mobility in substituted polythiophene-based diodes", *Synthetic Metals*, Elsevier Science B.V., 2002, 125: 419-422.

Willander, M., et al., "Polymer Based Devices Their Function and Characterization", *Synthetic Metals*, Elsevier Sequoia, 1993, 55-57: 4099-4104.

ORGANIC SEMICONDUCTOR DIODE

FIELD OF THE INVENTION

The present invention relates to semiconductor diodes, and more particularly to semiconductor diodes using organic materials.

BACKGROUND OF THE INVENTION

An organic diode has been fabricated which makes use of the electrical conductivity of a low-density polyethylene (LDPE) [L. Boundou, J. Guastavino, N. Zouzou, and J. Martinez Vega, Influence of Annealing Treatment on the Electrical Conductivity of Low Density Polyethylene, Polymer International, 50(9), 1046–1049 (2001), incorporated herein by reference]. This paper reports on the conductivity of semicrystalline, additive free (undoped) low-density polyethylene (LDPE) samples in the form of 100 µm thick discs prepared from hot pressed LDPE pellets. Both faces of each sample were coated with gold by vacuum deposition. The samples were studied by measuring the current through the structure during a stepwise increase in the applied voltage (i.e., in the electric field) at various temperatures. The results of experiments showed evidence of annealing-induced structural changes in the samples and related changes in the distribution of trapping centers. The structure of the samples was modified by temperature variations within the range used to study the conduction mechanism.

Another diode structure was fabricated [L. S. Roman and O. Inganas, Charge Carrier Mobility in Substituted Polythiophene-Based Diodes, Synthetic Metals, 125, 419–422 (2002), incorporated herein by reference] employing the semiconducting polymer poly[3-(2'-methoxy-5'-octylphenyl)-thiophene] (PMOPT) as the active layer material. The layer of the oxidized conducting polymer poly(3,4-ethylenedioxythiophene) doped by poly(4-styrenesulfonate) (PEDOT-PSS) is used as the anode. The diode was designed in the sandwich geometry with 6–10 mm active area. A copper film was deposited by evaporation onto half of a substrate. The PEDOT-PSS layer was deposited by spin coating from a 30% aqueous isopropanol solution filtered via 1-µm pore glass filter and patterned on copper. Then, the deposit was annealed during 5 min at 120° C. in order to remove residual water from the film. The semiconducting polymer was deposited by spin coating from a chloroform solution with a concentration of 5 mg/ml, to a layer thickness of 100 and 200 nm. The second electrode (Al) was vacuum deposited through a shadow mask defining the active area.

The current-voltage characteristic of the diode with a Cu/PEDOT-PSS anode was asymmetric with respect to reverse and forward bias, with a rectification range over five orders of magnitude. The capacitance versus voltage (C-V) characteristics were measured in the dark in the range of applied voltages from −3 to 3 V at a frequency of 50 kHz. The C-V characteristics of these devices agreed with the behavior of the current density and did not show evidence of a depletion layer (Schottky-type characteristics). For the reverse-biased diode with the Cu/PEDOT-PSS anode, the capacitance was constant at a forward voltage of up to 1.5 V and then continuously increased up to 3 V. It was suggested that the dependence of the carrier mobility $\mu$ on the electric field strength F was described by the formula $\mu = \mu_0 \exp[(F/F_0)^{1/2}]$, where $\mu_0$ is the zero-field mobility and $F_0$ is the characteristic field. The polymer parameters $\mu_0$ and $F_0$ were determined by fitting the experimental data for the PMOPT-based diode to this dependence. For two PMOPT-based diode samples (with L=100 and 200 nm), the zero-field mobility was found to be $\mu_0 = 2.4 \times 10^{-6}$ cm$^2$ V s with a characteristic field of $F_0 = 22.7$ kV/cm. By comparing these results to the data for poly[2-methoxy-5-(2'-ethyl-hexyloxy))-1,4-phenylene vinylene] (PMEH-PV), it was found that the carrier mobility in PMOPT was seven times higher than that in the poly(phenylene vinylene) derivative.

Organic diodes have been also made using Schottky contacts formed on a highly doped organic semiconductor [E. J. Lous, P. W. M. Blom, L. W. Molenkamp, and D. M. de Leeuw, Schottky Contacts on a Highly Doped Organic Semiconductor, Physical Review B, 51(23), 17252–17254 (1995), incorporated herein by reference]. In these diodes, the $\alpha$, $\alpha'$-coupled dodecathiophene oligomers with four n-dodecyl side chains at the thiophene rings 2, 5, 8, and 11:$T_{12}d_4$ have been used as semiconducting materials. The $T_{12}d_4$ was doped with 2,3-dichloro-5,6-dicyano-1,4-benzoquinone (DDQ) in THF solution. The doping level was defined as the percentage of donated holes per thiophene ring. One DDQ molecule can donate two holes, so that the number of DDQ molecules is half the doping level. The diode structures were obtained from $T_{12}d_4$ solutions to which DDQ was added to a doping level of 5%, which corresponds to a donated hole density of about $4 \times 10^{20}$ cm$^{-3}$. The diode comprises a thin layer with low acceptor density (p$^-$) at the metal-oligomer interface and a bulk semiconductor layer that has a higher dopant concentration (p$^+$). The films were spin-deposited onto glass substrates preliminarily provided with four deposited Au stripe contacts for determination of the bulk conductivity $\sigma_{bulk}$. Gold forms the ohmic contact with doped $T_{12}d_4$. In the diode structure, Au was used as the bottom electrode, while the top Schottky contact was obtained by depositing In onto the organic film at a pressure of about $10^{-6}$ Torr. The Schottky-type diodes made of highly doped oligomers showed considerably improved current density at 1 V, $J_F(1\text{ V})$, and had a rectification range over four orders of magnitude.

A metal-insulator-semiconductor (MIS) diode structure with poly(3-hexylthiophene) (P3HT) as the semiconductor was described by E. J. Meijer, A. V. G. Mangnus, C. M. Hart, D. M. de Leeuw, and T. M. Klapwijk [Frequency Behavior and the Mott-Schottky Analysis in Poly(3-hexylthiophene) Metal-Insulator-Semiconductor Diodes, Applied Physics Letters, 78(24), 3902–3904 (2001), hereby incorporated by reference]. The P3HT-based MIS diodes were fabricated on glass substrates using patterned indium tin oxide (ITO) contacts as gate electrodes. A 300 nm thick insulating layer of novolak photoresist was spin-coated on top of the gate. Over the insulator, a 200 nm thick P3HT film was spun from a 1 wt. % chloroform solution. Finally, a 10 nm thick gold layer was deposited through a shadow mask to form the ohmic contact with the P3HT layer.

The Schottky diodes of another type [M. Narasimhan, M. Hagler, V. Cammarata, and M. Thakur, Junction Devices Based on Sulfonated Polyaniline, Applied Physics Letters, 72(9), 1063–1065 (1998), hereby incorporated by reference] were fabricated using aluminum/neutralized sulfonated polyaniline (SPAN) junctions. Thin films of SPAN-based materials were prepared on an indium tin oxide (ITO) coated glass substrates. Aluminum was vacuum deposited on top at a pressure of $10^{-6}$ Torr. The contact between ITO and polyaniline was ohmic, whereas the Al-polyaniline contact showed very good Schottky diode properties.

There are planar Schottky barrier diodes [M. Willander, A. Assadi, and C. Svensson, Polymer Based Devices, Their Function and Characterization, Synthetic Metals, 55–57, 4099–4104 (1993), hereby incorporated by reference] fabricated using poly(3-alkylthiophene) (P3AT) as an active semiconductor, with aluminum and gold electrodes used as the Schottky and ohmic contacts, respectively. Poly(3-alkylthiophene) used in the diodes was a p-doped semiconductor. A P3TO layer was spun onto a silicon wafer substrate and then covered by silicon oxide. Both metal contacts were formed on silicon oxide by vacuum deposition at a pressure below $10^{-6}$ Torr. Electrical characterization confirmed diode behavior with a rectification ratio greater than 104 at a sufficiently high voltage. The ideality factor was as low 1.2.

Schottky diodes have been fabricated [V. Kazukauskas, H. Tzeng, and S. A. Chen, Trap Level and Effect of Oxygen in Poly[2-methoxy-5-(2'-ethyl-hexyloxy)-1,4-phenylene vinylene] Diodes, Applied Physics Letters, 80 (11), 2017–2019 (2002), hereby incorporated by reference] using poly[2-methoxy-5-(2'-ethyl-hexyloxy)-1,4-phenylene vinylene] as an active semiconductor, and aluminum and ITO glass electrodes as the Schottky and ohmic contacts, respectively.

In all examples of the organic diodes mentioned above, the organic layers do not possess a globally ordered crystalline structure. In addition, organic compounds used in said diodes have low values of the electric conductivity. Furthermore, the organic layers of organic diodes have been manufactured in relatively expensive production process. In particular, vacuum based deposition processes have been used to fabricate the organic components of organic diodes. These vacuum processes do not create cost advantage that would be expected from introduction of a new material in well known function. Another disadvantage of the aforementioned organic diodes is low temperature stability of the organic material itself. The desirable temperature range for diode operation in many applications is between –40 and 700° C. Present organic diodes do not satisfactorily meet these temperature requirements.

BRIEF SUMMARY OF THE INVENTION

The disclosed invention represents an organic semiconductor diode with p-n junction comprising: a first electrode, a first organic semiconductor layer, a second organic semiconductor layer, and a second electrode. The first organic semiconductor layer is made of hole transport material and coupled to the first electrode. Said second organic semiconductor layer is made of electron transport material and being in contact with the first layer at the junction. At least one of the hole or electron transport materials is characterized by a globally ordered crystalline structure with intermolecular spacing of 3.4±0.4 Å in the direction of one crystal axis, At least one of said transport layers is formed by rodlike supramolecules comprising at least one polycyclic organic compound with conjugated π-system. The polycyclic organic compound can be disc-shaped. The second electrode is coupled to the second layer such that the first and second electrodes are positioned to generate an electric field at the junction.

Another aspect of the present invention is an Schottky barrier diode comprising: an organic semiconductor layer, and a plurality of electrodes. The organic semiconductor layer is made of material characterized by a globally ordered crystalline structure with intermolecular spacing of 3.4±0.3 Å in the direction of one crystal axis. Said organic semiconductor layer is formed by rodlike supramolecules comprising at least one polycyclic organic compound with conjugated π-system. The plurality of electrodes is in contact with the organic semiconductor layer. At least one contact of the plurality of electrodes forms an Schottky contact with the organic semiconductor layer. At least one electrode of the plurality of electrodes forms an ohmic contact with the organic semiconductor layer.

An additional aspect of the present invention is a method for obtaining an organic semiconductor layer with the electron-hole type of conductivity. The method includes several steps. The first step is providing a substrate. The second step is deposition, by means of Cascade Crystallization Process (described in detail below), of at least one conjugated aromatic crystalline layer onto said substrate. The conjugated aromatic crystalline layer is characterized by the globally ordered crystalline structure with intermolecular spacing of 3.4±0.3 Å in the direction of one crystal axis. The conjugated aromatic crystalline layer is formed by rodlike supramolecules comprising at least one polycyclic organic compound with conjugated π-system. The conjugated aromatic crystalline layer has crystal hydrate and ionic structure in space between supramolecules. The third step is annealing of at least one deposited conjugated aromatic crystalline layer. The annealing is characterized by duration, character and temperature, which are selected so as to ensure full or at least partial removal of water molecules from said crystal hydrate structure, while retaining the structure of supramolecules and crystalline structure of conjugated aromatic crystalline layer intact.

BRIEF DESCRIPTION OF THE DRAWINGS

Other objects and advantages of the present invention will become apparent upon reading the detailed description of the invention and the appended claims provided below, and upon reference to the drawings, in which:

DETAILED DESCRIPTION OF THE INVENTION

Figure 1:
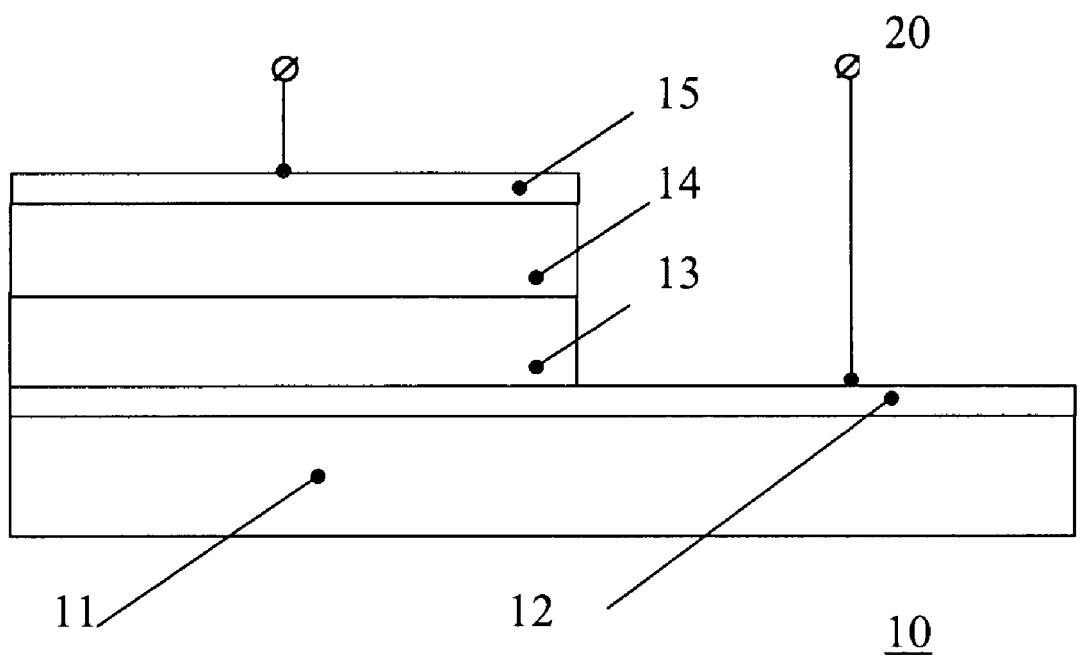
FIG. 1 is a schematic diagram showing the cross section of an organic semiconductor diode with a p-n junction according to one embodiment of the present invention.

The present invention now will be described more fully with reference to the accompanying drawings, in which preferred embodiments of the invention are shown. This invention may be, however, embodied in many different forms and should not be construed as limited to the embodiments set forth herein; rather, these embodiments are provided so that this disclosure will be thorough, and assist in conveying the scope of the invention to those skilled in the art. In the drawings, the thicknesses of separate layers and regions are exaggerated for clarity. Like numbers refer to the like elements throughout.

FIG. 1 shows the structure of an organic semiconductor diode with p-n junction 10 according to one embodiment of the present invention. As shown in the figure, the organic semiconductor diode is situated on substrate 11. The substrate 11 is preferably an insulating substrate, and any suitable insulating substrate may be used. Examples of insulating substrates include glass, quartz, silicon dioxide, polymers and plastics. In other embodiments, the substrate 11 includes a conductive material at least partially coated with an insulating material, including any of the insulating materials mentioned with regard to an insulating substrate.

An electrode serving as anode 12 is formed on the insulating substrate 10. The anode is generally formed from a conductive material, as known in the art. As is described further below, the anode 12 is preferably formed from a material having a work function higher than that of the second electrode serving as cathode 15. For instance, preferable materials include gold, platinum, palladium, indium tin oxide (ITO), iridium zinc oxide, zinc oxide, or an alloy of these metals. Tin oxide, selenium, copper iodide and nickel are also preferable in some embodiments. Further, a conductive polymer such as poly(3-methylthiophene), polyphenylene sulfide, or polyaniline may be used. These materials can be used separately or in the form of multilayer films applied one upon another, for instance, by applying a polyaniline film onto ITO film. Other conductive materials may be used for the anode 12. The anode 12 may be substantially any shape, but generally is positioned such that electrical contact 20 can be made to the anode. Although the electrical contact 20 is shown in FIG. 1 as being made to one side of the anode 12, away from the substrate 11, electrical contact 20 to the anode 12 could also be made through the substrate 11, as known in the art. Other anode materials may also be used.

A hole transport layer 13 including an organic compound makes contact with the anode 12 injecting holes into said hole transport layer. An electron transport layer 14 including an organic compound makes contact with a second electrode serving as cathode 15 injecting electrons into said electron transport layer. The hole transport layer 13 and the electron transport layer 14 are in contact with each other. In the embodiment shown in FIG. 1, the hole transport layer 13 and the electron transport layer 14 are illustrated on top of one another. Substantially any configuration of the hole and electron transport layers is possible in embodiments of the diode as long as they are positioned such that the anode 12 and the cathode 15 can generate an electric field across a junction between the hole and electron transport layers.

The hole transport layer and/or the electron transport layer may be formed by co-deposition of a mixture composed of several materials, each representing an organic compound possessing a transport ability. Further, the hole transport layer and/or the electron transport layer may be configured to include one or more mixed layers. The organic materials included in the hole and electron transport layers are described further below.

The hole transport layer and the electron transport layer, each made of an organic compound, are the kinds of semiconductors which can be regarded as a p-type organic semiconductor material and an n-type organic semiconductor material (hereinafter also referred to simply as the "p-type material" and the "n-type material"), respectively.

Electron and hole transport layers according to embodiments of the present invention preferably include organic semiconductor layers. The organic semiconductor layers can be formed by a method, called Cascade Crystallization Process developed by Optiva Inc. [P. Lazarev and M. Paukshto, Proceedings of the 7th International Workshop "Displays, Materials and Components" (Kobe, Japan, Nov. 29–Dec. 1, 2000), pp. 1159–1160] and further described in United States Published Patent application no. U.S. 2003/0154909, the disclosures of which are hereby incorporated by reference in their entirety. The organic semiconductor layers, and methods for making the layers, are described further below. Further description regarding organic semiconductor layers suitable for use with embodiments of the present invention are also found in U.S. Application Publication No. 2003/0154909.

Suitable cathode materials include silver, lead, tin, aluminum, calcium, indium, chromium, an alkali metal such as magnesium or lithium, or an alloy of these metals (such as Ca—Al, Mg—Ag, and Li—Al). Further, it is possible to use an alkali metal compound or an alkaline-earth metal compound with the work functions lower than about 4.5 eV.

Cathode 15 cooperates with the anode 12 to apply an electric field to the junction formed by the hole transport layer 13 and the electron transport layer 14.

The organic semiconductor diode may also consist of the component layers applied onto the substrate in the reverse order as compared to that in the example given in FIG. 1, that is, in the following order: the cathode, the electron transport layer, the hole transport layer, and the anode. The cathode and anode electrodes, the hole transport layer, and the electron transport layer may have multilayer structures.

The disclosed organic semiconductor diode with p-n junction operates generally as follows. When an applied bias voltage is equal to zero the diode is in thermal equilibrium and an electrical current is approximately zero. The two kinds of organic materials in thermal equilibrium have the same Fermi levels. The thermal equilibrium is achieved by diffusion of the charge carriers (free electrons and holes) through the junction interface. As a result, an internal electric field is generated within the junction. The internal electric field causes the vacuum level to move, and the edges of energy bands to bend. The internal electric field generated between the conduction bands of the p-type and the n-type organic materials serves as a potential barrier preventing electrons of the n-type material from moving into the region of the p-type material. Further, the internal electric field generated between the valence bands of the same junction serves as another potential barrier preventing holes from moving from the region of the p-type material to the region of the n-type material. When a reverse bias voltage is applied to the organic p-n junction the potential barriers are increased and current continues to remain around zero.

When a forward bias voltage is applied to the organic p-n junction, electrons are injected from the cathode into the n-type material and holes are injected from the anode into the p-type material. The injected electrons and holes are accumulated at the junction interface. When the bias voltage exceeds a certain threshold, electrons overcome the potential barrier to move from the region of the n-type material of the p-n junction into the region of the p-type material of the same junction. As a result, the electrons diffuse and recombine with holes to be lost. Thus, the injection of charge carriers causes a current to flow in an external circuit coupled to the cathode and anode.

Thus, the organic semiconductor diodes exhibit nonlinear current-voltage characteristics when a voltage is applied between the hole transport layer and the electron transport layer.

Figure 2:
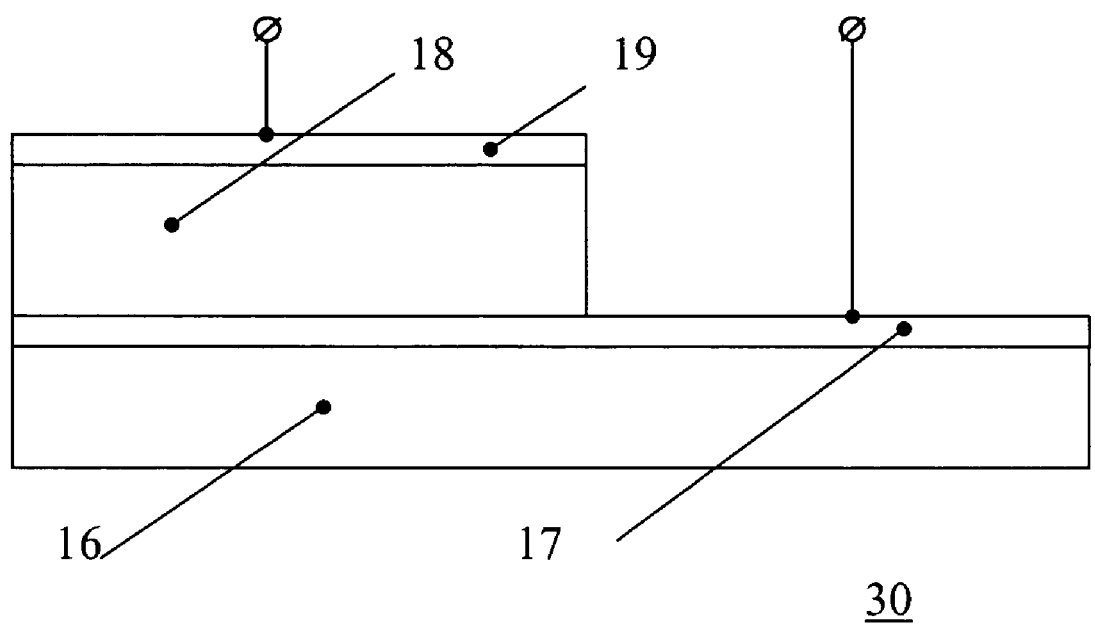
FIG. 2 is a schematic diagram showing the cross section of an organic semiconductor diode with the Schottky contact, according to another embodiment of the present invention.

FIG. 2 illustrates an organic semiconductor diode with a Schottky barrier according to another embodiment. The Schottky barrier diodes are known as semiconductor devices performing the rectifying function and may be used in rectifying applications such as power switching. Power switching at a high conversion efficiency may be used to rectify alternating input voltage into direct voltage, to convert a direct voltage into alternating voltage having a high frequency via an ON-OFF circuit, to transform the alternating voltage by means of a transformer, and then rectify the resulting voltage again to convert it into direct voltage. In the power switching regime, Schottky barrier diodes having high-speed switching characteristics are used as devices for performing high-frequency rectification. Significant factors for determining the efficiency of power switching include the losses in the ON-OFF circuit and the forward voltage drop in the diode performing high-frequency rectification.

FIG. 2 shows a vertical cross section of a Schottky barrier diode 30 according to the present invention. As can be seen in FIG. 2, the Schottky barrier diode is formed on a substrate 16. The substrate 16 is preferably insulating or coated with an insulating materials and may be formed of the materials described above with regard to the substrate 11 in FIG. 1. An organic semiconductor layer 18 is in electrical contact with the electrodes labeled 17 and 19. In one embodiment, the electrode 17 forms ohmic contacts with the organic semiconductor layer 18, and the electrode 19 forms the Schottky contact with the transport layer 18. In another embodiment, the electrode 19 forms the ohmic contact with the organic semiconductor layer 18, while the electrode 17 forms the Schottky contact with the organic semiconductor layer 18.

Common electrode materials (with low work function) for the electron collecting ohmic contact of organic semiconductor diode or Schottky barrier diode are silver, lead, tin, aluminum, calcium, indium, chromium, an alkaline-earth metal such as magnesium or lithium, and an alloy of these metals such as Ca—Al, Mg—Ag, and Li—Al, and an alkali metal compound, and an alkaline-earth metal compound, or combinations thereof. At the same time electrode materials (with high function) for the hole collecting ohmic contact of organic semiconductor diode or Schottky barrier diode are nickel, gold, platinum, palladium, indium, ITO, iridium zinc oxide, zinc oxide, selenium, copper iodide, poly(3-methylthiophene), polyphenylene sulfide, and polyaniline, or combinations thereof.

The organic semiconductor layer of the present invention is made of material characterized by a globally ordered crystalline structure with intermolecular spacing of 3.4±0.3 Å in the direction of one crystal axis. Said layer is formed by rodlike supramolecules comprising at least one polycyclic organic compound with conjugated π-system.

The disclosed Schottky barrier diode operates as well as the described above organic semiconductor diode with p-n junction except that the area of internal electric field is situated between the contact with Schottky barrier and organic semiconducting layer.

Indium Tin Oxide (ITO) which is a degenerated semiconductor comprising a mixture of $In_2O_3$ (80–90%) and $SnO_2$ (20–10%) with a bandgap of 3.7 eV and a Fermi level between 4.5 and 4.9 eV is used in the organic semiconductor diode with p-n junction and the Schottky barrier diode which are disclosed in the present invention. The material can be highly conducting if there is excess of In due to a lack of oxygen—so that In acts as n-type dopant leading to very low sheet resistance for approximately 100 nm thick electrode layers of ITO. Very thick ITO layers (several 100 nm-microns) are problematic because of the increased absolute surface roughness which can cause shorts in the thin organic films.

The ITO layers can be obtained by hf sputtering from an 80 at-% $In_2O_3$/20 at-% $SnO_2$ target onto substrates. The sputter atmosphere can be composed of argon ($10^{-2}$ Torr) and oxygen ($0 \leq p_{O2} \leq 2 \cdot 10^{-2}$ Torr). At oxygen pressure of $2 \cdot 10^{-2}$ Torr no argon be present. Either the oxygen partial pressure $PO_2$, or the layer thickness d, or the sputtering power p can be changed as parameters. The substrate temperature increased with increasing sputtering power. The growth rate of the layers can be about 1.4 Ås$^{-1}$ at 100W sputtering power.

The most common methods of physical-vapor deposition (PVD) of metallic electrodes are evaporation, e-beam evaporation, plasma spray deposition, and sputtering. The metals and metal compounds described above can be deposited by PVD. Evaporation occurs when a source material is heated above its melting point in an evacuated chamber. The evaporated atoms then travel at high velocity in straight-line trajectories. The source can be molten by resistance heating, by rf heating, or with a focused electron beam.

The resistance of ITO and metallic electrode layers can be measured by the four-point probe technique. The probes are equally spaced. A small current (I) from a constant-current source is passed through the outer two probes, and a voltage (V) is measured between the inner two probes. For a thin sample of layer with thickness (d) that is much smaller than the sample diameter (D), the resistivity (p) is given by expression $$\rho = V \cdot d \cdot CF/I, \Omega \cdot cm$$

where CF is known as the correction factor. The correction factor depends on the ratio of D/s, where s is the probe spacing. When D/s>20, the correction factor approaches 4.54. The sheet resistance (Rs) is described by expression Rs=ρ·d.

According to the present invention, the hole transport layer and the electron transport layer representing organic semiconductor layers with hole and electron type of conductivity, respectively, are based on an aromatic polycyclic compound. There is provided a developed system of π-conjugated bonds between conjugated aromatic rings of the molecules and the presence of groups (such as amine, phenol, ketone, etc.) lying in the plane of the molecule and involved into the aromatic system of bonds. The molecules and/or their molecular fragments possess a planar structure and are capable of forming supramolecules in solutions. Maximum overlap of π orbitals in the stacks of supramolecules is provided.

The organic semiconductor layers, which are used in the organic semiconductor diode according to the present invention, can be formed by a method, referred to as Cascade Crystallization Process developed by Optiva Technology and described in detail in U.S. Published Patent Application No. 2003/0154909, incorporated by reference [see also P. Lazarev and M. Paukshto, *Proceedings of the 7th International Workshop "Displays, Materials and Components"* (Kobe, Japan, Nov. 29–Dec. 1, 2000), pp. 1159–1160, incorporated herein by reference]. According to this method, an organic compound dissolved in an appropriate solvent forms a colloidal system (lyotropic liquid crystal solution) in which molecules are aggregated into supramolecules constituting kinetic units of the system. Said organic compound comprises crystal hydrate and ionic structures in a space between supramolecules. This liquid crystal phase is essentially a precursor of the ordered state of the system, from which a solid anisotropic crystal film (called thin crystal film, TCF) is formed in the course of subsequent alignment of the supramolecules and removal of the solvent.

A method stipulated for the synthesis of organic semiconductor layer (anisotropic semiconducting thin crystal films) from a colloidal system with supramolecules includes the following steps or stages:

(i) application of the aforementioned colloidal system onto a substrate (or onto a device or a layer in a multilayer structure); the colloidal system possesses thixotropic properties, which are provided by maintaining a preset temperature and a certain concentration of the dispersed phase;

(ii) conversion of the applied colloidal system into a high flow (reduced viscosity) state by any external action (heating, shear straining, etc.) decreasing viscosity of the solution; this action can be either applied during the whole subsequent alignment stage or last for a minimum necessary time, so that the system would not relax into a state with increased viscosity during the alignment stage;

(iii) external alignment action upon the system, which can be produced using mechanical factors or by any other means; the degree of the external action must be sufficient for the kinetic units of the colloidal system to acquire the necessary orientation and form a structure that would serve as a base of the crystal lattice of the anisotropic thin crystal film;

(iv) conversion of the aligned region of the layer from the state of reduced viscosity, achieved due to the external action, into the state of the initial or higher viscosity; this transition is performed so as not to cause disorientation of the anisotropic thin crystal film structure and not to produce surface defects;

(v) final stage of solvent removal (drying), in the course of which the final anisotropic thin crystal structure of semiconductor layer is formed; this stage can also include an additional thermal treatment (annealing) characterized by the duration, character, and temperature, which are selected so as to ensure full or at least partial removal of water molecules from said crystal hydrate structure, while retaining the structure of supramolecules and crystalline structure of conjugated aromatic crystalline layer intact.

In the resulting anisotropic organic semiconductor layer, the molecular planes are parallel to each other and the molecules form a three-dimensional crystal structure, at least in a part of the layer. Optimization of the production technology may allow the formation of a single crystal semiconductor layer.

The organic semiconductor layer thickness usually does not exceed 1 μm. The layer thickness can be controlled by changing the content of a solid substance in the applied solution and by varying the applied layer thickness. In order to obtain the organic semiconductor layers possessing desired optical characteristics, it is possible to use mixed colloidal systems (such mixtures can form joint supramolecules).

The mixing of said organic compounds in solutions results in the formation of mixed aggregates of variable composition. The analysis of X-ray diffraction patterns for dye mixtures allow us to judge about the molecular packing in supramolecules by the presence of a characteristic diffraction peak corresponding to interplanar spacings in the range from 3.1 to 3.7 Å. In the general case, this value is common for aromatic compounds in the form of crystals and aggregates. The peak intensity and sharpness increase in the course of drying, however, no changes in the peak position are observed. This diffraction peak corresponds to the intermolecular spacing within aggregates (stacks) and has been observed in the X-ray diffraction patterns of various materials. The mixing is favored by the planar structure of molecules (or their fragments) and by the coincidence of one molecular dimension in the organic compounds under consideration. In the applied aqueous layer, the organic molecules possess a long-range order in one direction, which is related to the alignment of supramolecules on the substrate surface. As the solvent is evaporated, it is energetically favorable for the molecules to form a three-dimensional crystal structure.

An organic semiconductor layer produced by this method has a global order or, in other words, such film has a globally ordered crystalline structure. The global order means that the deposition process controls the direction of the crystallographic axis of the organic semiconductor layer over the entire layer surface or the substrate surface. Thus, the organic semiconductor layer differs from a polycrystalline layer, in which the uniform crystalline structure is formed inside a separate grain. The area of such a grain is much smaller than the area of the organic semiconductor layer surface or the substrate surface. Also, in the organic semiconductor layers under consideration, a limited influence of the substrate surface on the crystalline structure takes place. The organic semiconductor layer can be formed on a part of the substrate surface or on the entire surface, depending on the particular device requirements. In both cases, the organic semiconductor layer is characterized by a global order.

An organic semiconductor layer formed by said method possesses a globally ordered structure of special type. This layer is not crystalline or polycrystalline in the usual sense. The method of coating provides control of the crystallographic orientation of the organic semiconductor layer formed on the substrate during deposition, drying, and crystallization. The organic semiconductor layer possesses a monoclinic symmetry. Flat molecules of the organic substance, for example of an aromatic organic dye, are packed in a layered crystalline structure with a flat plane oriented perpendicularly to the surface of the substrate and the coating direction.

Another aspect of the present invention is application of an organic semiconductor layer as a printable high-temperature material, a semiconductor material, or a conductor material.

Low sensitivity of the disclosed organic semiconductor diode with respect to changes of the ambient temperature is achieved because the organic semiconductor layers possess higher thermal stability in comparison with traditional materials: the heat treatment of organic semiconductor layers can be performed at temperatures up to 700° C. in air and in an argon atmosphere without noticeable changes in the electrical properties. The ability of the disclosed organic semiconductor diodes to retain working properties at high ambient temperatures allows using these diodes in electronic devices intended for operation in a steelmaking industry (e.g., in molten metal level meters), in the aerospace industry (e.g., in electronic devices operating in the nozzles of thrusters), and in other high-temperature applications.

Another advantage of using organic semiconductor layers in the disclosed organic semiconductor diodes is that these semiconducting crystalline layers allow using the technology of printing for forming semiconductor layers of these diodes.

It is possible to obtain organic semiconductor layers possessing hole or electron transport ability and/or optical properties. In many respects the said ability of organic semiconductor layer is determined by properties of used polycyclic organic compound. For manufacturing the organic semiconductor layer having electron transport ability a sulfoderivatives of phthalocyanines can be used as one of polycyclic organic compounds. On the other hand, for manufacturing the organic semiconductor layer having hole transport ability a sulfoderivatives of perynone dyes can be used as one of polycyclic organic compound.

The present invention employs an initial polycyclic organic compound containing at least one doping agent—doping element (foreign molecules) and/or organic compound.

In inorganic semiconductors, the doping consists in introducing impurity atoms, for example, in the course of epitaxial growth or by ion implantation techniques. As a result, the number of mobile charge carriers (electrons and holes) in the semiconductor increases. Additional mobile charge carriers, in turn, increase the electric conductivity of the material.

In organic semiconductors, doping is usually performed by introducing foreign molecules, rather than atoms. Another possibility of reaching the same goal in the organic compounds with conjugated bonds consists in using electrochemical oxidation or reduction. The effect of doping-that is, a change in the concentration of mobile charge carriers-is frequently achieved by trapping the carriers (e.g., electrons in the conduction band of the semiconductor) on traps. As a result, the ratio of the number of mobile holes in the valence band to the number of mobile electrons in the conduction band increases, the Fermi level shifts toward the valence band top, and the semiconductor acquires conductivity of the p-type. Thus, the doping of an organic semiconductor can change the character of conductivity, for example, from electron to hole type. The list of doping impurities suited for the obtaining of doped p-type semiconductors contains a number of inorganic and organic molecules, including $Cl_2$, $NO_2$, $I_2$, $Br_2$, O-chloranil, 2,4,7-trinitrofluorenone, $H_2O$, and $O_2$. Other dopants leading to conductivity of the p-type are tetra-cyano-quino-di-methane (TCNQ) and some other substances possessing high values of the electron work function, such as fullerene $C_{60}$, cyano substituted -poly(paraphenylene vinylene) (CN-PPV), and perylene diimides. There are certain functionalities that are likely to make a material the electron acceptor with respect to most other materials. Examples of such functionalities favoring the electron acceptor properties are CN, $CF_3$, F, keto groups, and diimides. These additives are known to produce electron withdrawal when attached to an unsaturated (conjugated) system. Most organic semiconductors behave more like electron donors. Examples are poly (paraphenylene vinylene) (PPV), poly(thiophene) (PT), poly(paraphenylene) (PPP), and phthalocyanines. The result of doping molecular semiconductors frequently consists in increasing the density of mobile charge carriers, which leads to a significant increase in the conductivity. Such effects can be achieved, for example, through complexation with foreign molecules. It is desired that such molecules would be sufficiently large not to diffuse into adjacent materials. In devices based on the p-n junction, the diffusion of impurity molecules can lead to degradation of the junction. Examples are offered by the doping of poly(aniline) (PANI) with camphorsulfonic acid or the doping of poly(ethylene dioxythiophene) (PEDOT) with polystyrenesulfonic acid.

Thus the dopant can be either a donor impurity, favoring the formation of an organic semiconductor layer with the electron conductivity, or an acceptor impurity, favoring the formation of a organic semiconductor layer with the hole conductivity. In addition, the doping additives introduced into the organic substance can modify the dynamic properties of the mobile charge carriers (electrons and/or holes). In particular, properly selected dopants can significantly increase the drift mobilities of both electrons and holes in the external electric field.

The resistivity ($\rho$) and sheet resistance (Rs) of organic semiconductor layer can be measured by the four-point probe technique described above. The type of conduction of an organic semiconductor layer (electron transport material or hole transport material) is defined by methods known in the art by using the Hall effect or thermoprobe.

One preferred embodiment of the invention is an organic semiconductor diode with p-n junction comprising: a first electrode, a first organic semiconductor layer, a second organic semiconductor layer, and a second electrode. The first organic semiconductor layer is made of a hole transport material and coupled to the first electrode. Said second organic semiconductor layer is made of an electron transport material and being in contact with the first layer at the junction. At least one of the hole or electron transport materials characterized by a globally ordered crystalline structure with intermolecular spacing of 3.4±0.3 Å in the direction of one crystal axis. At least one of said transport layers is formed by rodlike supramolecules comprising at least one polycyclic organic compound with conjugated π-system. The polycyclic organic compound can be disc-shaped. The second electrode is coupled to the second layer such that the first and second electrodes are positioned to generate an electric field at the junction.

In one embodiment of the disclosed organic semiconductor diode, the polycyclic organic compound comprises at least one component of the general structural formula {R}{F}$_n$, where R is a polycyclic organic compound with conjugated π-system, F are modifying functional groups, and n is the number of functional groups.

In particular, these polycyclic organic compounds include the following:

sulfoderivatives of perynone dyes with the general structural formula from the group comprising of structures I–XVII:

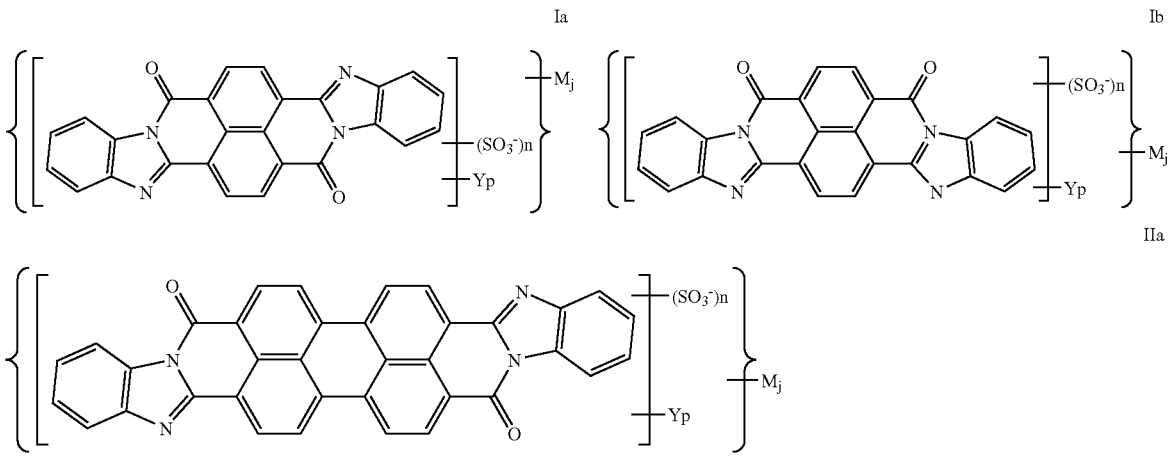

-continued
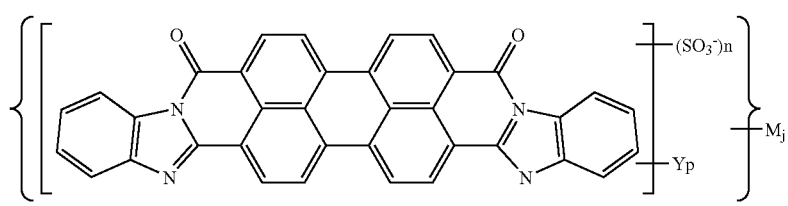
IIb
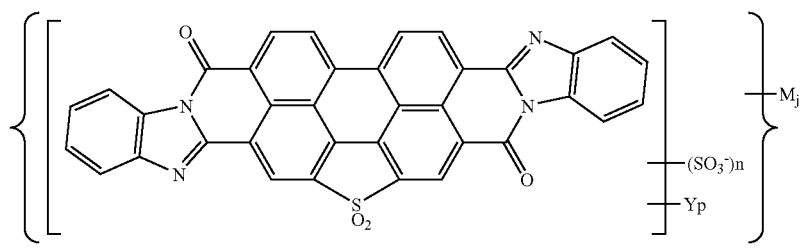
IIIa
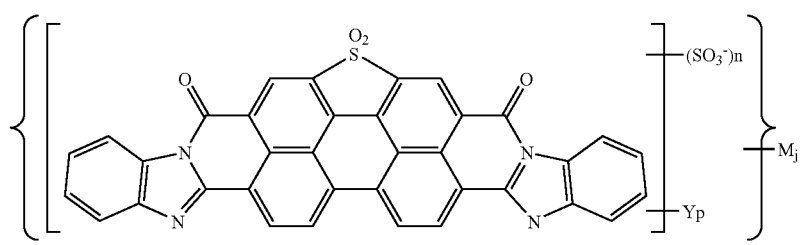
IIIb
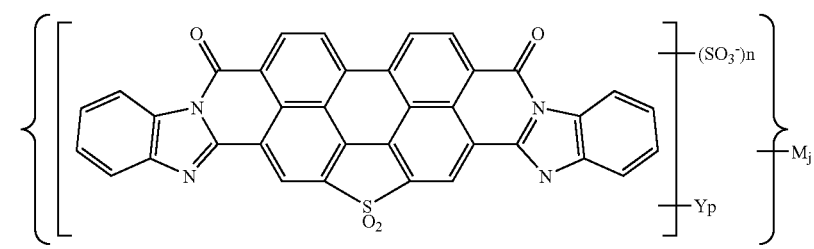
IVa
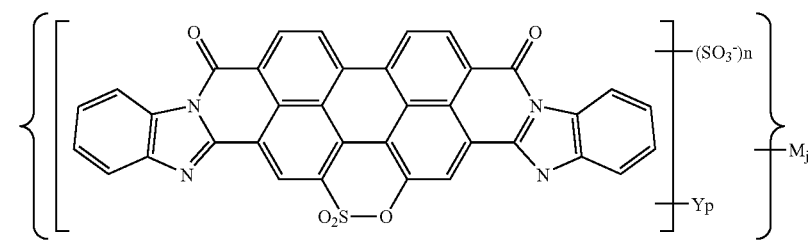
IVb
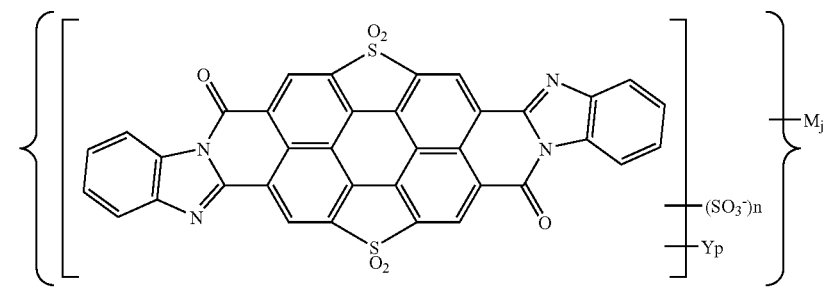
Va -continued
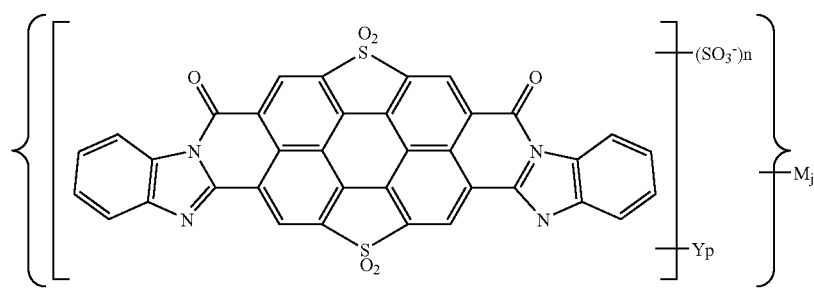
Vb
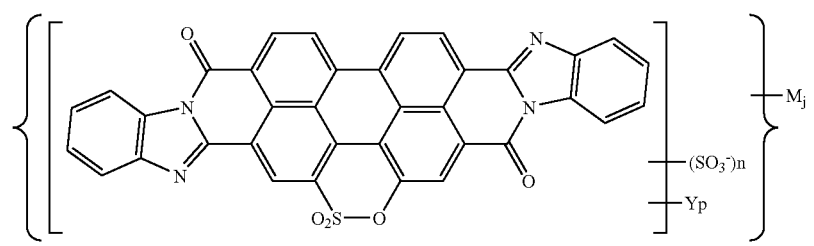
VIa
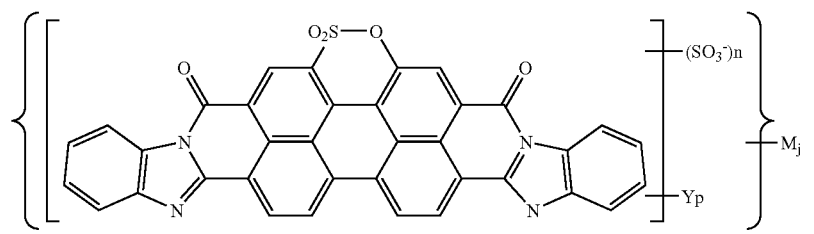
VIb
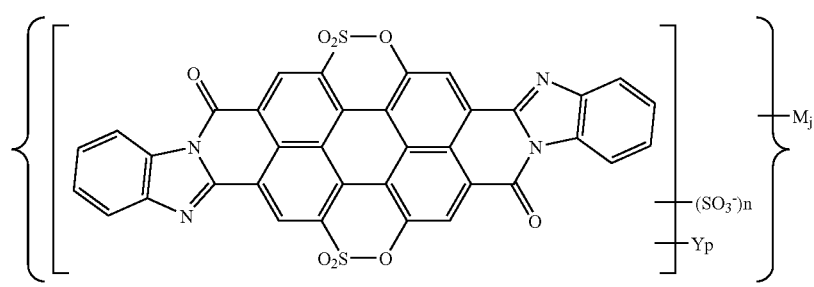
VIIa
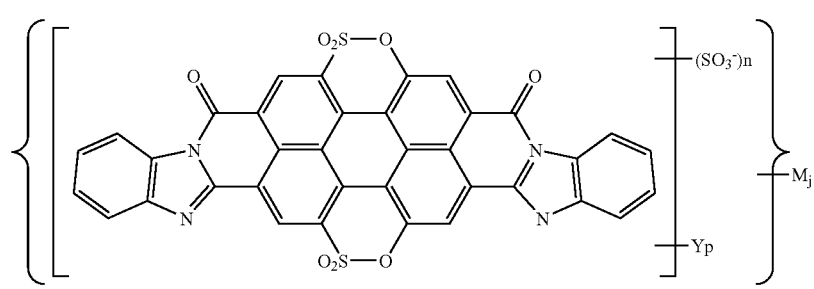
VIIb -continued
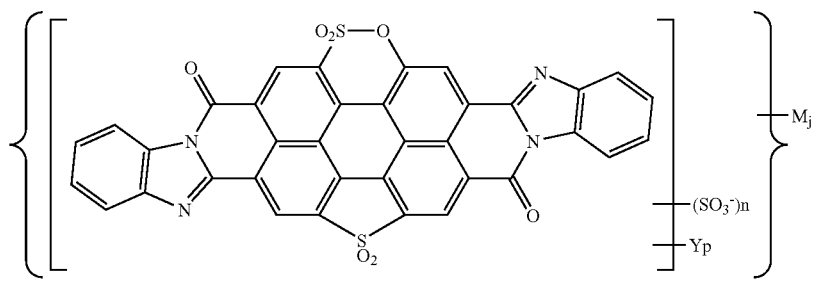
VIIIa
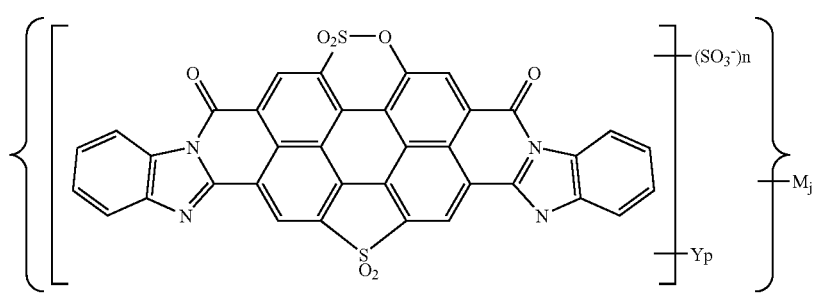
VIIIb
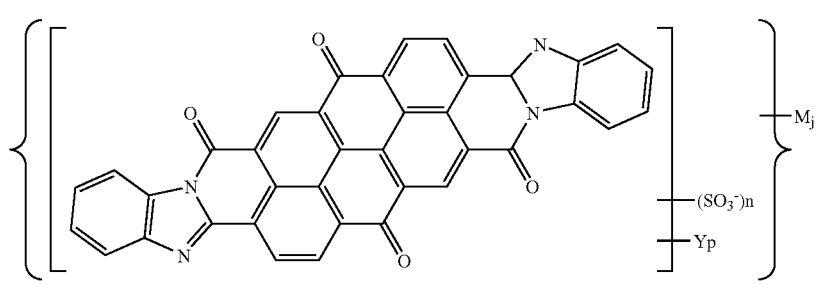
IXa
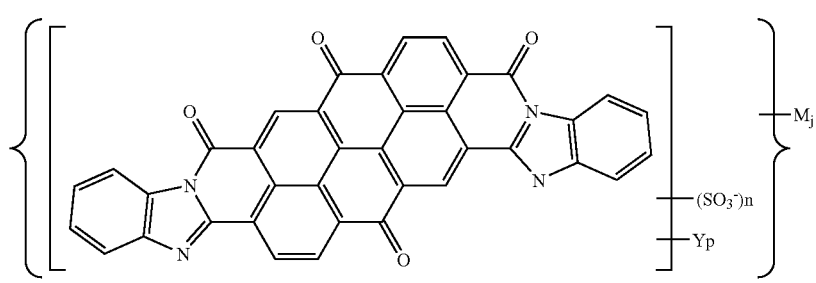
IXb
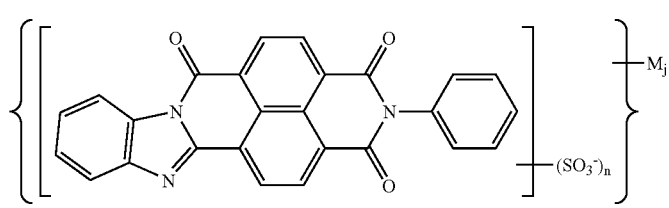
Xa
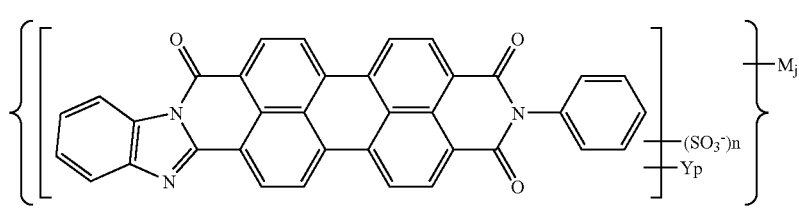
Xb

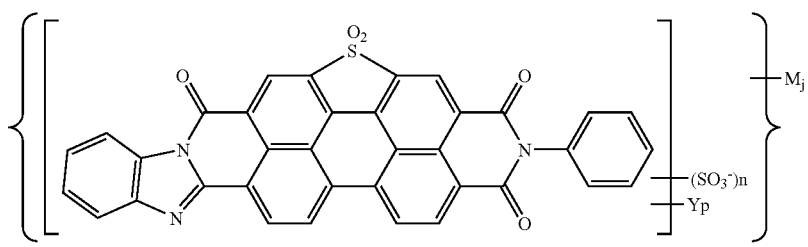
XIa
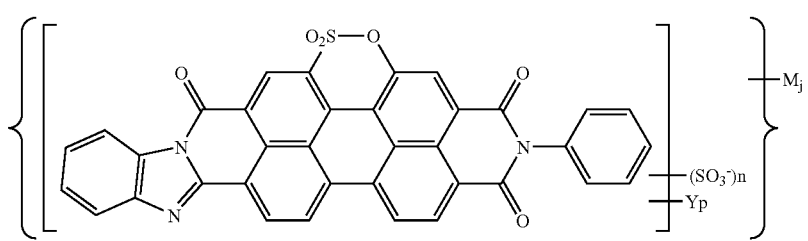
XIb
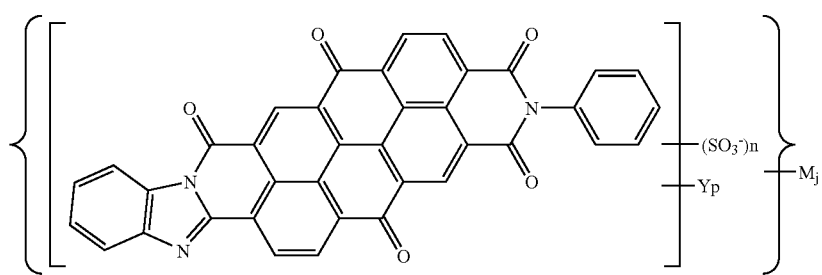
XII
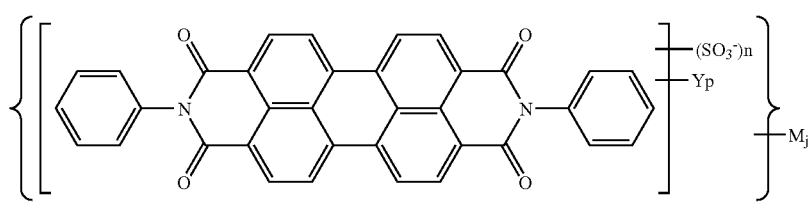
XIII
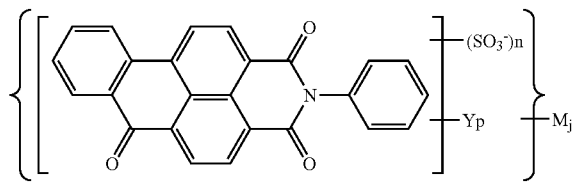
XIV
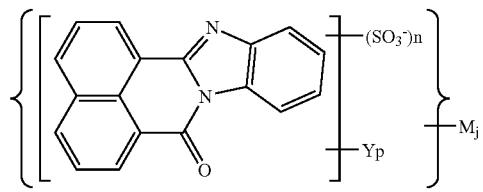
XV
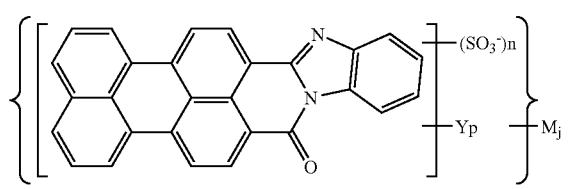
XVI
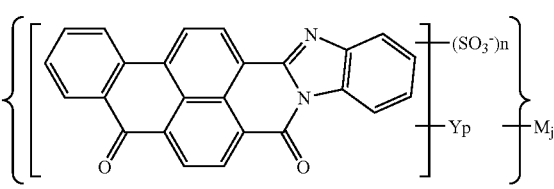
XVII
where n is an integer in the range of 1 to 4 and p is an integer in the range of 0 to 6; Y is individually selected from the group consisting of H, Cl, F, Br, Alk, OH, OAlk, $NO_2$ and $NH_2$; M is a counterion; and j is the number of counterions in the molecule; for n>1, different counterions M can be involved;

sulfoderivatives of heteroaromatic polycycloquinones with the general structural formulas XVIIIa–XVIIId:

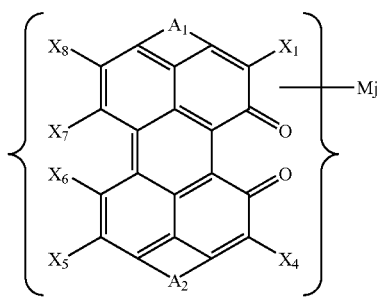

XVIIIa

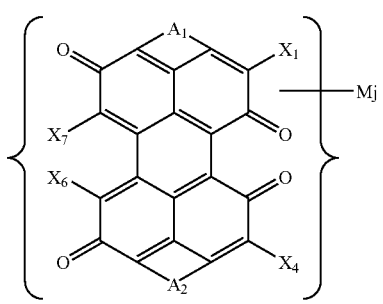

XVIIIb

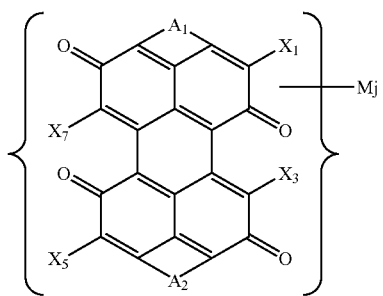

XVIIIc

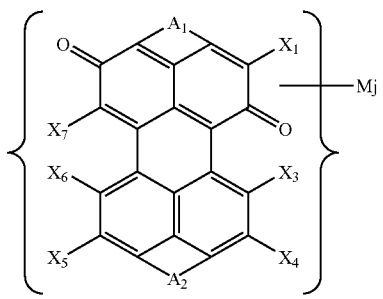

XVIIId where $A_1$ и $A_2$ are fragments of the general structural formula

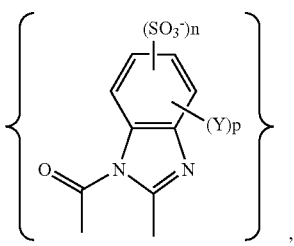

$X_1, X_3, X_4, X_5, X_6, X_7, X_8$ are substituents from the group including H, OH, and $SO_3H$, such that at least one of these substituents is different from H; Y is a substituent from the series H, Cl, F, Br, Alk, OH, OAlk, NO2, NH2; p is an integer in the range of 0, 1, 2, 3 and 4; n is one of the group including 0, 1, 2, such that at least one of fragments $A_1$ or $A_2$ comprises at least one sulfogroup; M is counterion; and j is the number of counterions in the molecule, which can be fractional if the counterion belongs to several molecules; for n>1, different counterions M can be involved;

sulfoderivatives of dyes with fused anthraquinone fragment of the general structural formulas from the group XIX–XXIII:

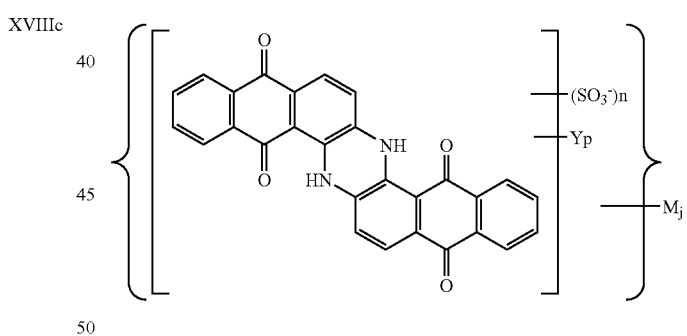

XIXa

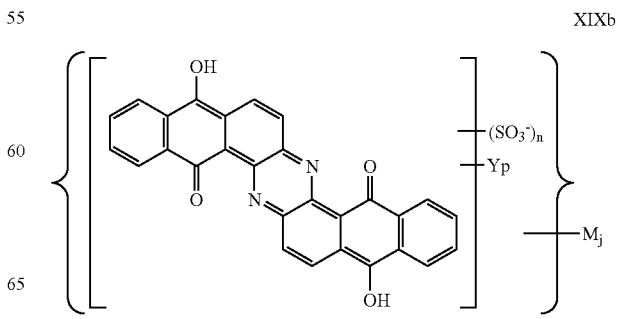

XIXb

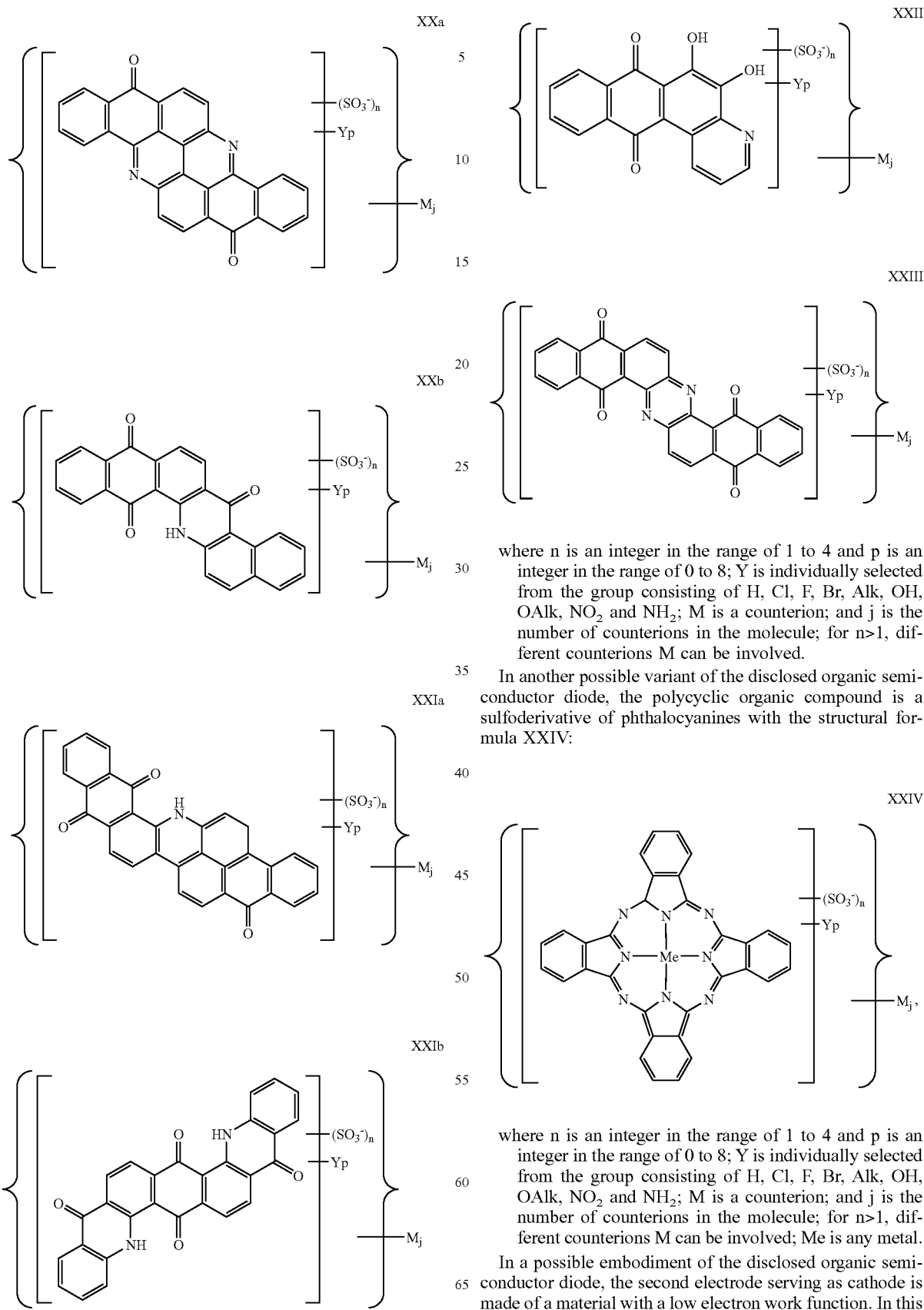

where n is an integer in the range of 1 to 4 and p is an integer in the range of 0 to 8; Y is individually selected from the group consisting of H, Cl, F, Br, Alk, OH, OAlk, $NO_2$ and $NH_2$; M is a counterion; and j is the number of counterions in the molecule; for n>1, different counterions M can be involved.

In another possible variant of the disclosed organic semiconductor diode, the polycyclic organic compound is a sulfoderivative of phthalocyanines with the structural formula XXIV:

where n is an integer in the range of 1 to 4 and p is an integer in the range of 0 to 8; Y is individually selected from the group consisting of H, Cl, F, Br, Alk, OH, OAlk, $NO_2$ and $NH_2$; M is a counterion; and j is the number of counterions in the molecule; for n>1, different counterions M can be involved; Me is any metal.

In a possible embodiment of the disclosed organic semiconductor diode, the second electrode serving as cathode is made of a material with a low electron work function. In this case, the cathode is made of any material of the list comprising silver, lead, tin, aluminum, calcium, indium, chromium, an alkali metal such as magnesium or lithium, and an alloy of these metals (such as Ca—Al, Mg—Ag and Li—Al). Further, it is possible to use an alkali metal compound, an alkaline-earth metal compound, or combinations thereof.

In another embodiment of the organic semiconductor diode, the first electrode serving as anode is made of a material with a high electron work function. In this case, the anode is made of any material of the list comprising nickel, gold, platinum, palladium, indium, ITO, iridium zinc oxide, zinc oxide, selenium, copper iodide, poly(3-methylthiophene), polyphenylene sulfide, and polyaniline, or combinations thereof.

Another preferred embodiment of the present invention is an Schottky barrier diode comprising: an organic semiconductor layer, and a plurality of electrodes. The organic semiconductor layer is made of material characterized by a globally ordered crystalline structure with intermolecular spacing of 3.4±0.3 Å in the direction of one crystal axis. Said organic semiconductor layer is formed by rodlike supramolecules comprising at least one polycyclic organic compound with conjugated π-system. The plurality of electrodes is in contact with the organic semiconductor layer. At least one contact of the plurality of electrodes forms an Schottky contact with the organic semiconductor layer. At least one contact of the plurality of electrodes forms an ohmic contact with the organic semiconductor layer. The polycyclic organic compound can be disc-shaped.

In one possible variant of the disclosed Schottky barrier diode, said polycyclic organic compound contains at least one component of the general structural formula $\{R\}\{F\}_n$, where R is a polycyclic organic compound with conjugated π-system, F are modifying functional groups, and n is the number of functional groups.

In a possible variant of the Schottky barrier diode, said polycyclic organic compound is a sulfoderivative of a perynone dye with the general structural formula from the group consisting of structures I–XVII:

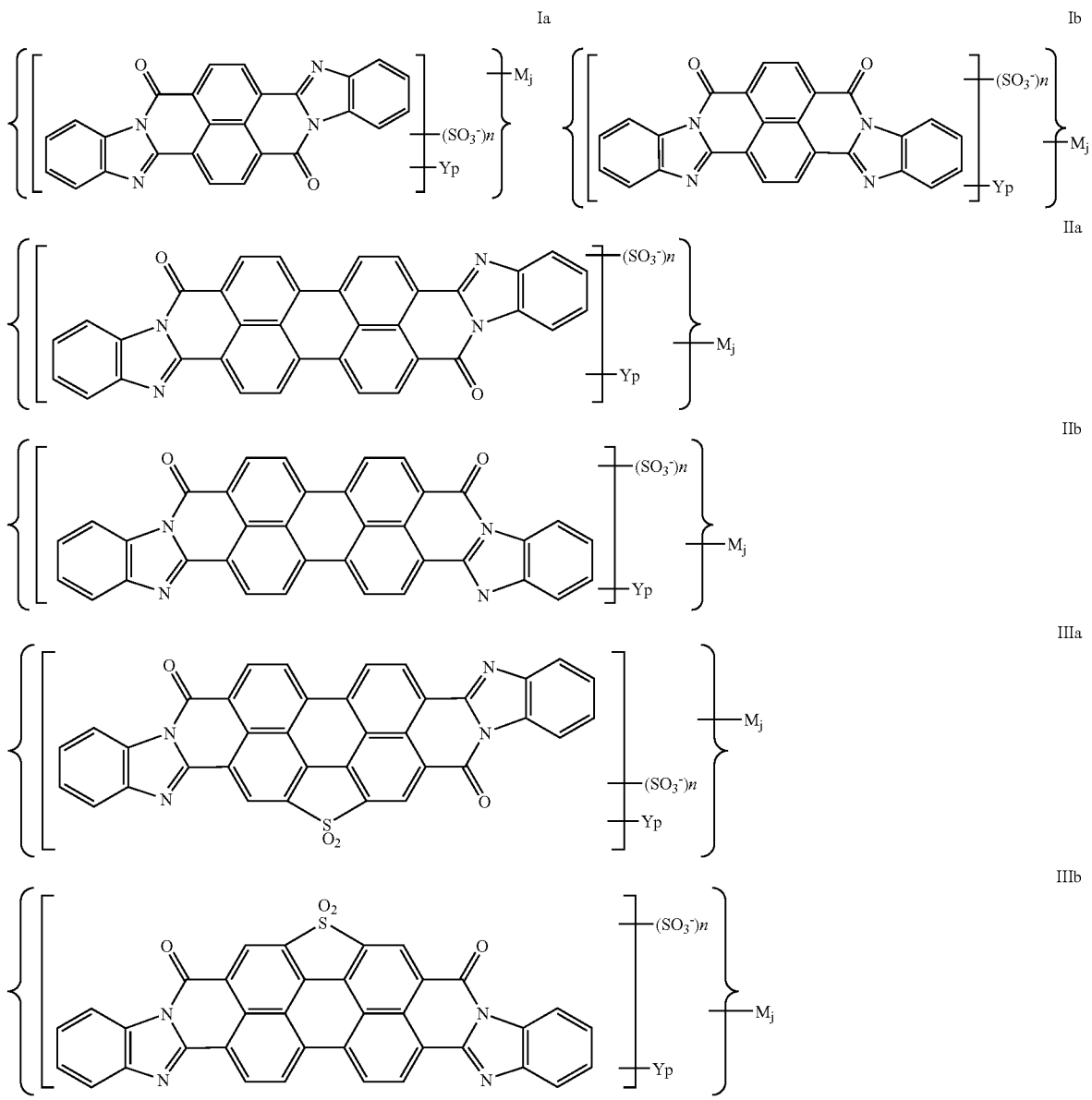

-continued
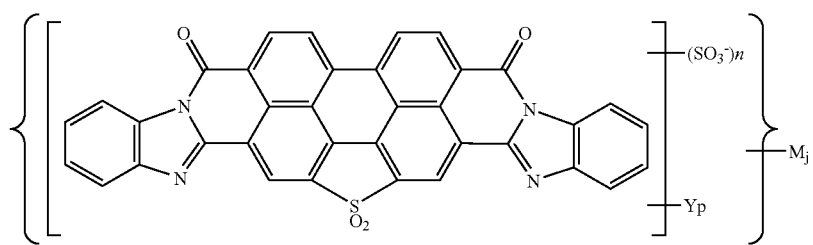
IVa
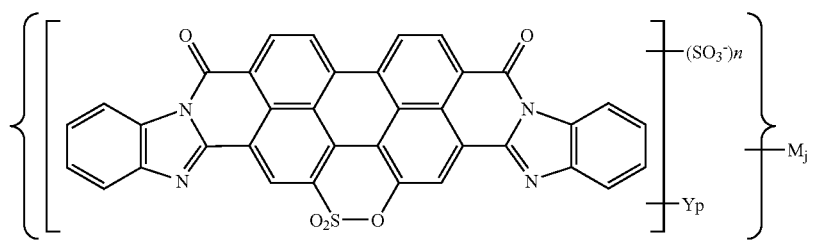
IVb
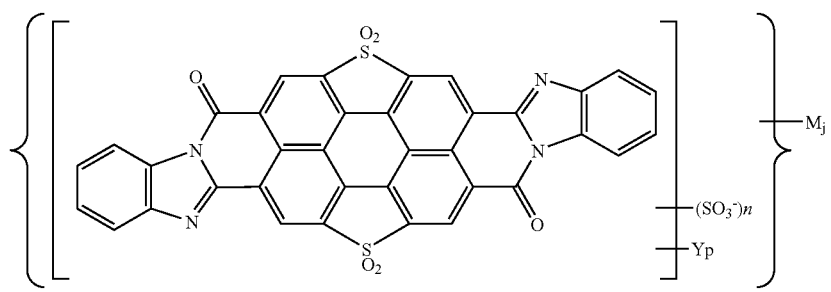
Va
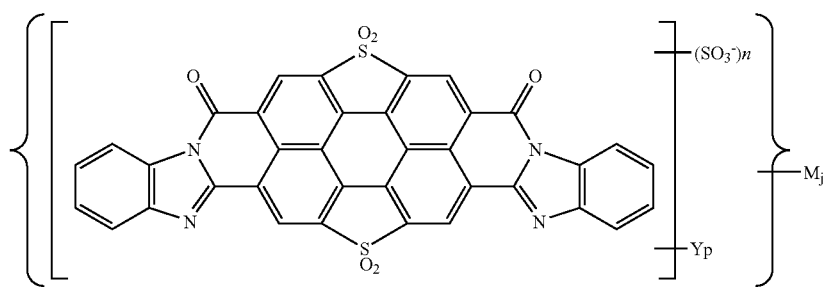
Vb
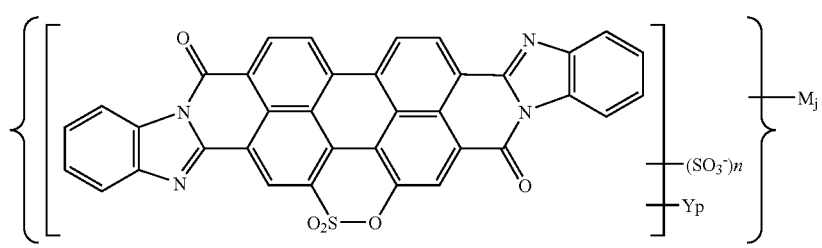
VIa
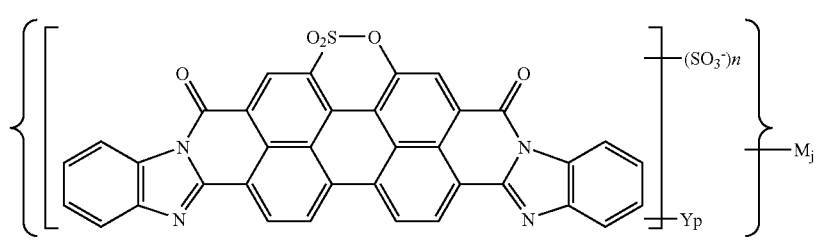
VIb

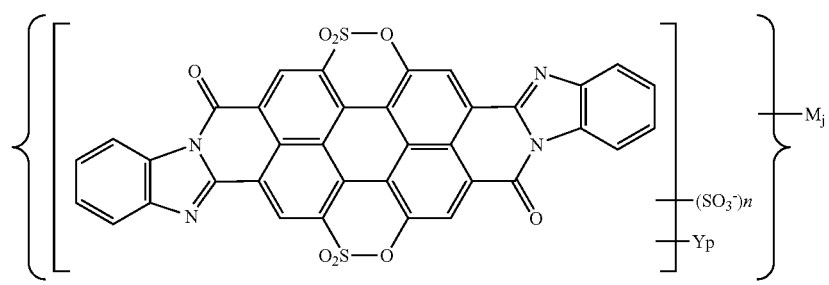
VIIa
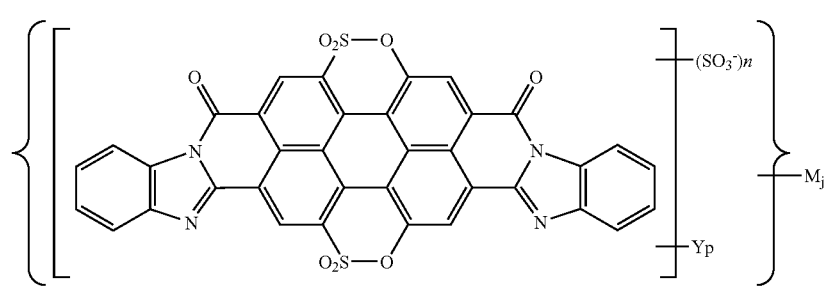
VIIb
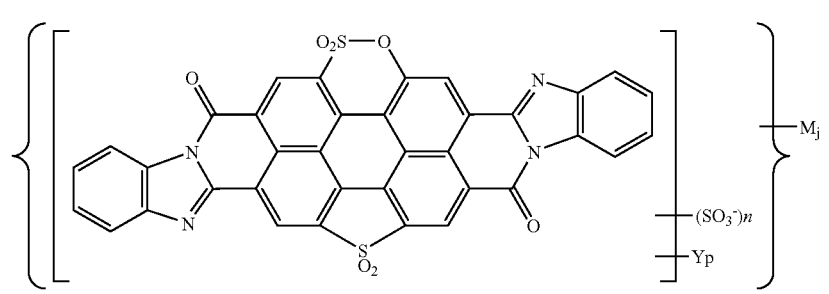
VIIIa
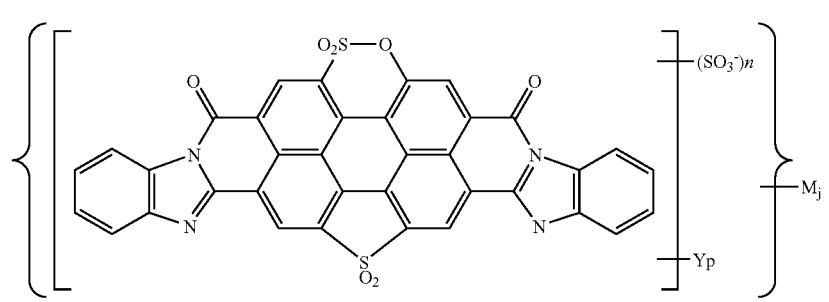
VIIIb
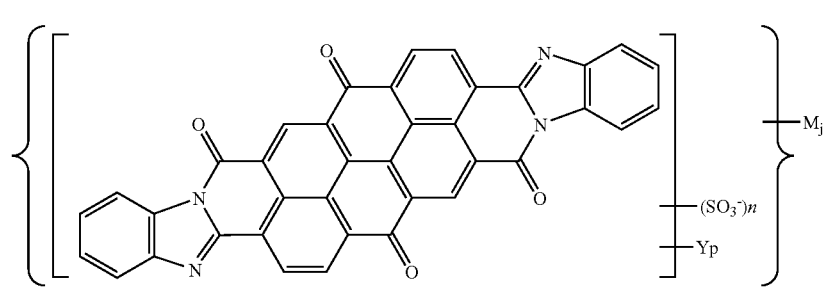
IXa -continued
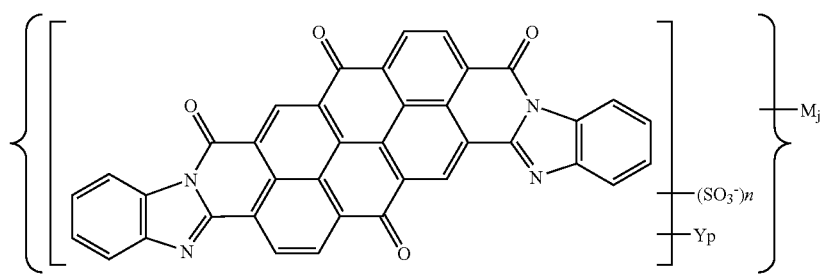
IXb
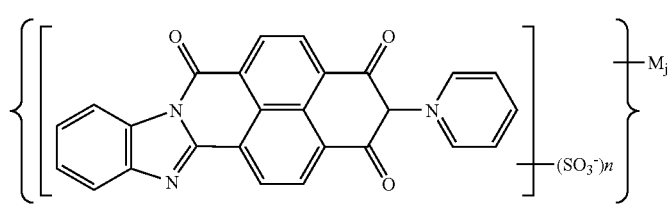
Xa
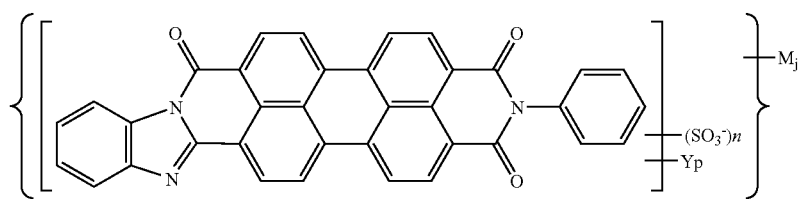
Xb
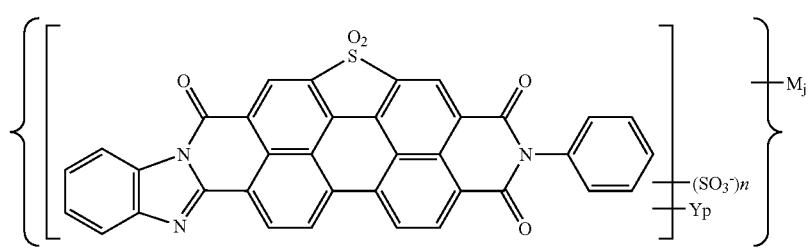
XIa
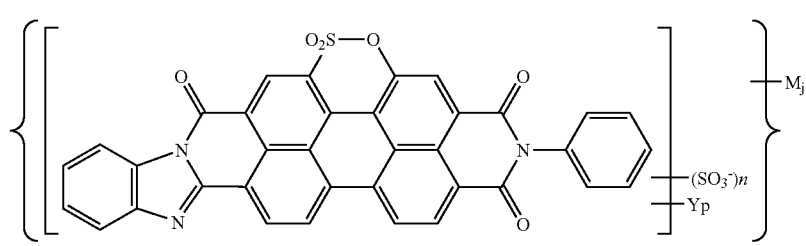
XIb
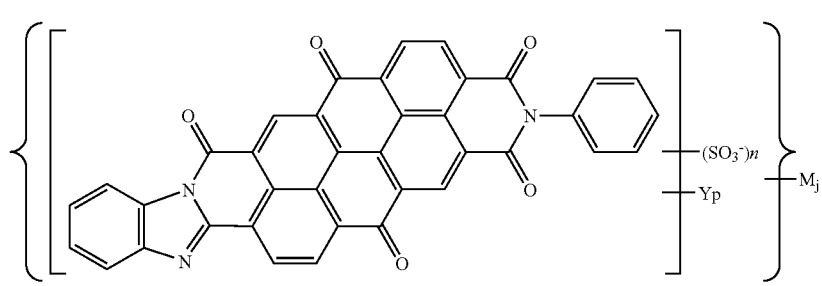
XII

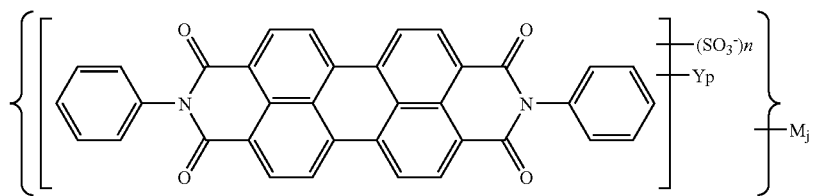

XIII

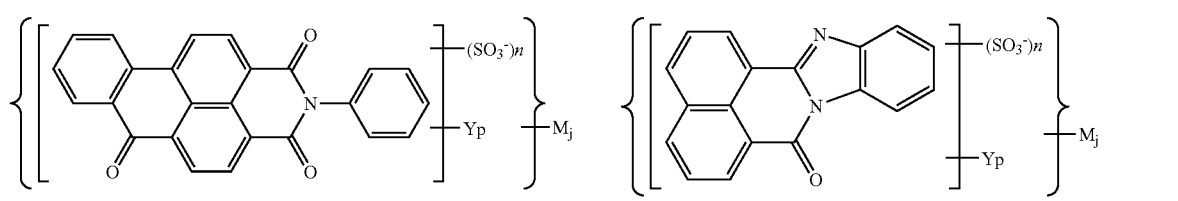

XIV    XV

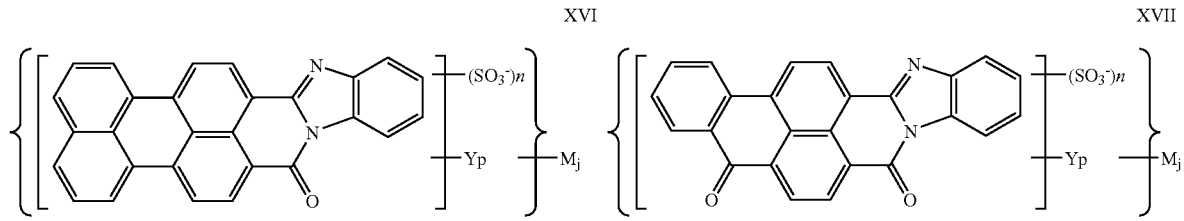

XVI    XVII where n is an integer in the range of 1 to 4 and p is an integer in the range of 0 to 6; Y is individually selected from the group consisting of H, Cl, F, Br, Alk, OH, OAlk, $NO_2$ and $NH_2$; M is a counterion; and j is the number of counterions in the molecule; for n>1, different counterions M can be involved.

In another variant of the Schottky barrier diode, said polycyclic organic compound is a sulfoderivative of a heteroaromatic or aromatic polycycloquinone with the general structural formula from the group XVIIIa–XVIIId:

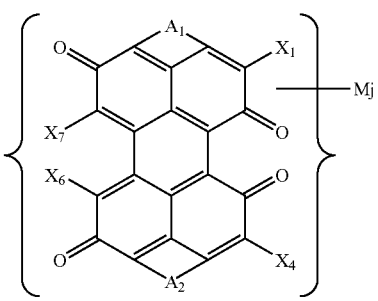

XVIII b

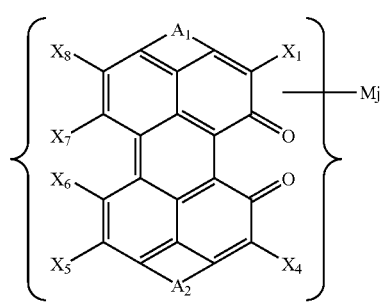

XVIII a

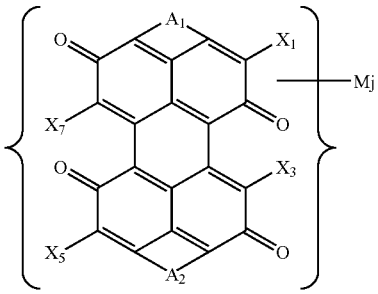

XVIII c

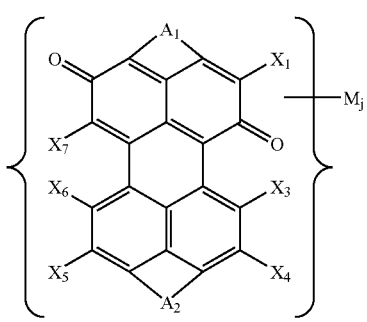

XVIII d

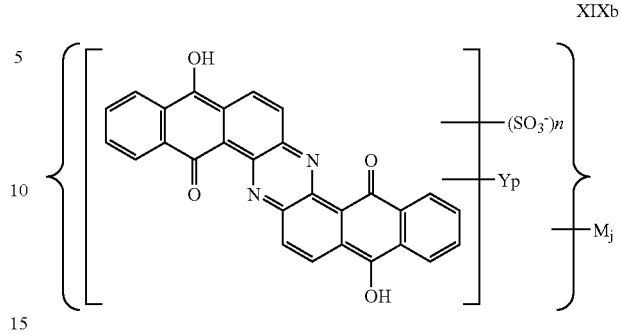

XIXb where $A_1$ и $A_2$ are fragments of the general structural formula

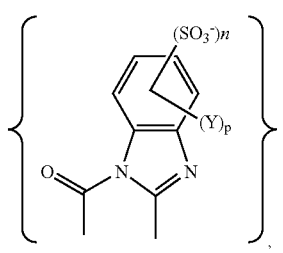

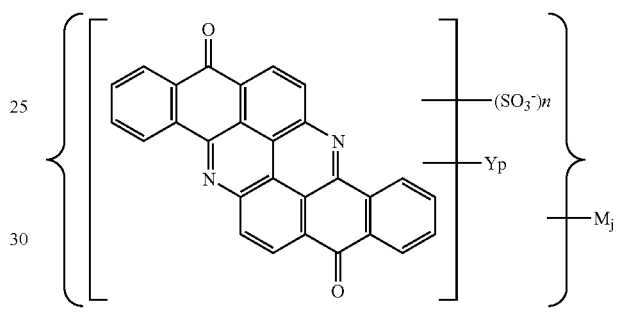

XXa $X_1$, $X_3$, $X_4$, $X_5$, $X_6$, $X_7$, $X_8$ are substituents from the group including H, OH, $SO_3H$, such that at least one of these substituents is different from H; Y is a substituent from the series H, Cl, F, Br, Alk, OH, OAlk, NO2, NH2; p is an integer in the range of 0, 1, 2, 3 and 4; n is one of the group including 0, 1, 2, such that at least one of fragments $A_1$ or $A_2$ comprises at least one sulfogroup; M is counterion; and j is the number of counterions in the molecule, which can be fractional if the counterion belongs to several molecules; for n>1, different counterions M can be involved.

In another embodiment of the Schottky barrier diode, said polycyclic organic compound is a sulfoderivative of dyes with fused anthraquinone fragment of the general structural formulas from the group XIX–XXIII:

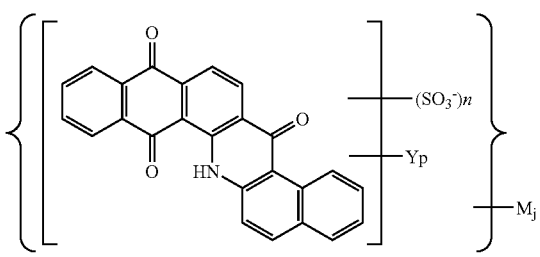

XXb

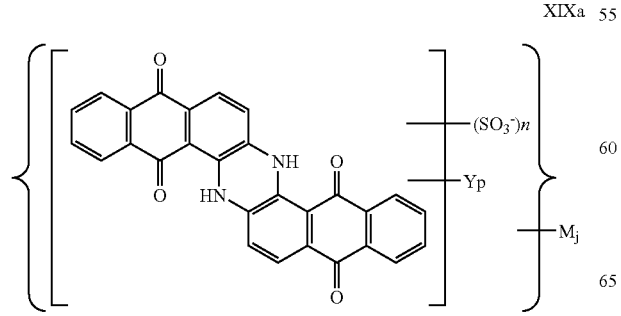

XIXa

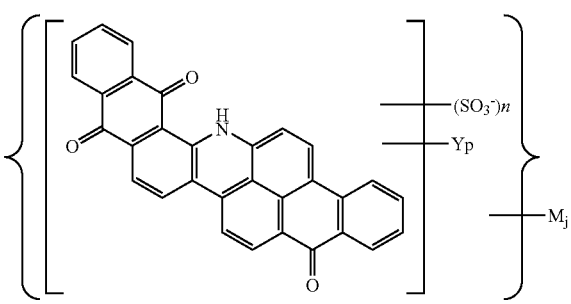

XXIa

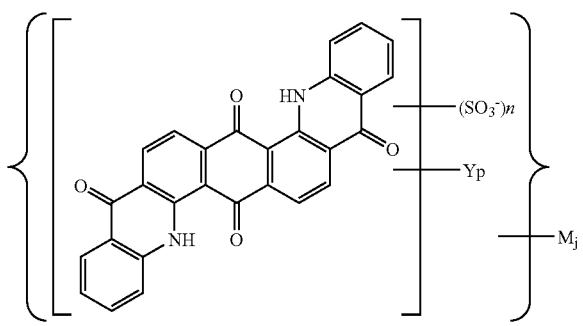

XXIb

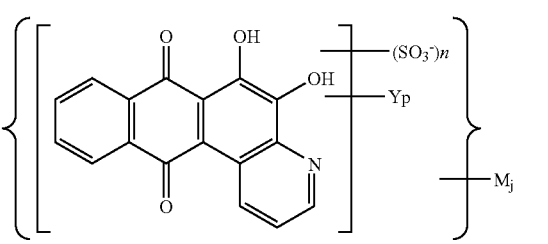

XXII

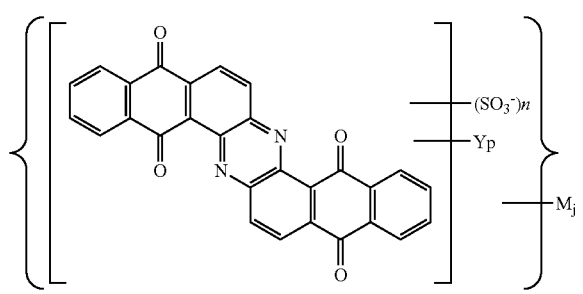

XXIII where n is an integer in the range of 1 to 4 and p is an integer in the range of 0 to 8; Y is individually selected from the group consisting of H, Cl, F, Br, Alk, OH, OAlk, NO$_2$ and NH$_2$; M is a counterion; and j is the number of counterions in the molecule; for n>1, different counterions M can be involved.

In one possible variant of the Schottky barrier diode, said polycyclic organic compound is a sulfoderivative of phthalocyanines with the structural formula XXIV:

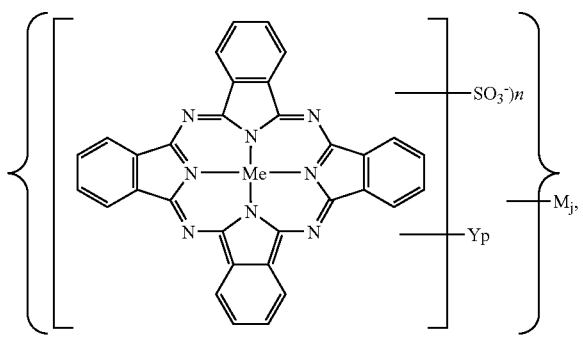

XXIV where n is an integer in the range of 1 to 4 and p is an integer in the range of 0 to 8; Y is individually selected from the group consisting of H, Cl, F, Br, Alk, OH, OAlk, NO$_2$ and NH$_2$; M is a counterion; and j is the number of counterions in the molecule; for n>1, different counterions M can be involved; Me is any metal.

In still another variant of the Schottky barrier diode according to the invention, said organic semiconductor layer is made of an organic compound possessing the electron transport ability, at least one electrode possessing the Schottky contact is made of a material with a high electron work function, and at least one electrode possessing the ohmic contact is made of a material with a low electron work function. The electrode with Schottky contact is made of a material with a high electron work function selected, in particular, from the group comprising nickel, gold, platinum, palladium, indium, ITO, iridium zinc oxide, zinc oxide, selenium, copper iodide, poly(3-methylthiophene), polyphenylene sulfide, and polyaniline, or combinations thereof. The electrode with ohmic contact is made of a material with a low electron work function selected, in particular, from the group comprising silver, lead, tin, aluminum, calcium, indium, chromium, an alkali metal such as magnesium or lithium, and an alloy of these metals (such as Ca—Al, Mg—Ag, and Li—Al). Further, it is possible to use an alkali metal compound, and an alkaline-earth metal compound, or combinations thereof.

In one embodiment of the disclosed Schottky barrier diode according to present invention, the organic semiconductor layer is made of an organic compound possessing the hole transport ability, at least one electrode possessing the ohmic contact is made of a material with a high electron work function, and at least one electrode possessing the Schottky contact is made of a material with a low electron work function. The electrode with ohmic contact is made of a material selected, in particular, from the group comprising nickel, gold, platinum, palladium, indium, ITO, iridium zinc oxide, zinc oxide, selenium, copper iodide, poly(3-methylthiophene), polyphenylene sulfide, and polyaniline, or combinations thereof. The electrode with Schottky contact is made of a material with a low electron work function selected, in particular, from the group comprising silver, lead, tin, aluminum, calcium, indium, chromium, an alkaline-earth metal such as magnesium or lithium, and an alloy of these metals (such as Ca—Al, Mg—Ag, and Li—Al). Further, it is possible to use an alkali metal compound, and an alkaline-earth metal compound, or combinations thereof.

Once formed, embodiments of diodes according to the present invention may be used in a variety of applications including, for example, power switching, rectifying variable signals, and frequency mixing (multiplexing).

In a preferred embodiment, the disclosed invention provides a method for obtaining an organic semiconductor layer. The method includes several steps. The first step is providing a substrate. The second step is deposition, by means of Cascade Crystallization Process, of at least one conjugated aromatic crystalline layer onto said substrate. The conjugated aromatic crystalline layer is characterized by the globally ordered crystalline structure with intermolecular spacing of 3.4±0.3 Å in the direction of one crystal axis. The conjugated aromatic crystalline layer is formed by rodlike supramolecules comprising at least one polycyclic organic compound with conjugated π-system. The conjugated aromatic crystalline layer has crystal hydrate and ionic structure in space between supramolecules. The third step is annealing of at least one deposited conjugated aromatic crystalline layer. The annealing is characterized by duration, character and temperature, which are selected so as to ensure full or at least partial removal of water molecules from said crystal hydrate structure, while retaining the structure of supramolecules and crystalline structure of conjugated aromatic crystalline layer intact. In one embodiment of the method annealing of the conjugated aromatic crystalline layer is performed by local or total heating of the conjugated aromatic crystalline layer up to a temperature in the range between 350 and 700° C.

In a possible embodiment of the disclosed method, the substrate is made of a material whose temperature of decomposition is higher than the temperature to which the substrate is heated in the course of said annealing. In one embodiment of the method, the substrate is made of one or several materials of the group comprising plastics, glasses, ceramics, metal-ceramic composites, and metals. In another embodiment, the substrate is made of a flexible material. In still another variant of the disclosed method, the substrate is made of a rigid material, Possible embodiments of the disclosed method include the cases whereby the surface of the substrate is flat, convex, concave, or possesses a complicated geometric shape combining these forms. In still another embodiment of the disclosed method, at least a part of the substrate surface possesses anisotropic properties, which are caused either by chemical bonds, or by a relief or texture formed on the substrate surface using the substrate material or some another material. In a possible embodiment of the disclosed method, wherein prior to the step of the deposition of a conjugated aromatic crystalline layer the method further comprises a step of the formation of at least one alignment layer on said substrate. In one embodiment, said alignment layer is deposited onto the substrate by method of oblique deposition of a special material from a gas (vapor) phase. In a particular embodiment of the present method, said special material is silicon dioxide. In another embodiment of the invention, at least one alignment layer is made of a polymer material oriented by rubbing in a certain preset direction. In another embodiment, at least one alignment layer is made of a photosensitive polymeric material oriented by exposure to a polarized light. One possible embodiment of the disclosed method includes the annealing performed in a buffer gas atmosphere. The buffer gas is any gas selected from the list comprising He, Ar, Xe or any other inert gase, $N_2$, $CO_2$, and any other nonreactive gas. In a possible embodiment of the disclosed method, said organic compound includes at least one aromatic component of the general structural formula {K}(M)n, where K is a polycyclic organic compound with conjugated π-system; M are modifying functional groups; and n is the number of functional groups. In a possible embodiment of the disclosed invention, prior to the step of the deposition of the conjugated aromatic crystalline layer the method further comprises a step of the formation of at least one electrode on said substrate.

EXAMPLES

A number of experiments were conducted according to the present invention. These experiments are intended for illustration purposes only, and are not intended to limit the scope of the present invention in any way.

Example 1

The organic semiconductor diodes with the p-n junction were prepared as follows. Thin films of materials specified below were sequentially applied onto a glass substrate. First, an ITO film with a thickness of 1100 Å was formed by vacuum deposition at a pressure of 5.0×10−6 Torr to serve as the anode. Then, a thin film of a sulfoderivative of copper phthalocyanines with the structural formula XXIV was formed on the ITO layer by method of Cascade Crystallization Process to serve as the hole transport layer. The thickness of this layer was 0.3 μm. Next, a thin film of a perylene derivative with the formula (Ia) was formed over the hole transport layer by method of Cascade Crystallization Process to serve as the electron transport layer. The thickness of the electron transport layer was also 0.3 μm. Further, a thin film of lithium oxide (LiO2) was deposited onto the electron transport layer at a rate of 1 Å/sec to serve as the cathode. The LiO2 layer thickness was 0.5 nm. Finally, the LiO2 layer was covered by a thin film of aluminum (Al) which served as an auxiliary electrode. Aluminum was deposited at a rate of 10 Å/sec to a total thickness of 100 nm. This completed the preparation of an organic semiconductor diode with the p-n junction.

Example 2

The organic semiconductor diode with the p-n junction was prepared similarly to the diode described in Example 1, except that perylene derivatives represented by the formula (Va)

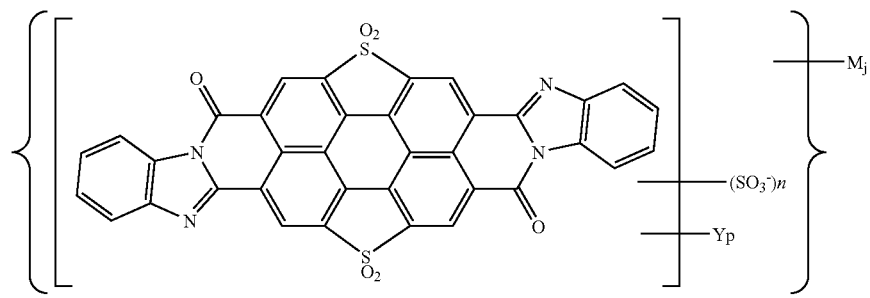

was used as material for the electron transport layer.

Example 3

The organic semiconductor diode with the p-n junction was prepared similarly to the diode described in Example 1, except that perylene derivatives represented by the formula (Vb)

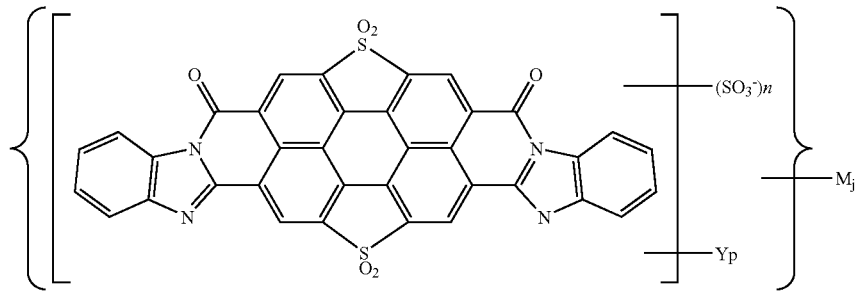

was used as material for the electron transport layer.

Example 4

The organic semiconductor diode with the p-n junction was prepared similarly to the diode described in Example 1, except that perylene derivatives represented by the formula (VIa)

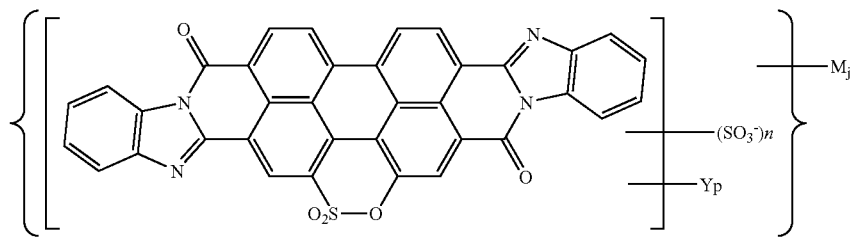

was used as material for the electron transport layer.

Example 5

The organic semiconductor diode with the p-n junction was prepared similarly to the diode described in Example 1, except that perylene derivatives represented by the formula (VIb)

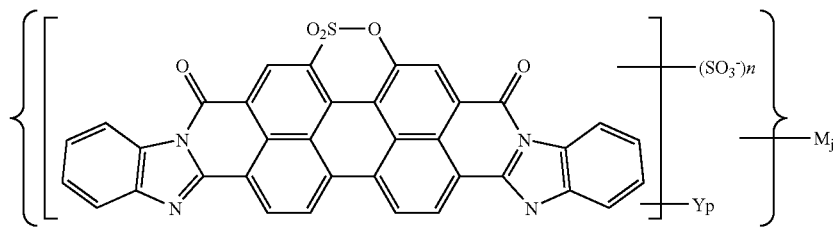

was used as material for the electron transport layer.

Example 6

The organic semiconductor diode with the Schottky contact was prepared as follows. Thin films of materials specified below were sequentially applied onto a glass substrate. First, an ITO film with a thickness of 1100 Å was formed by vacuum deposition at a pressure of $5.0 \times 10^{-6}$ Torr to serve as the anode. Then, a thin film of a perylene sulfoderivative with the structural formula (XIXa) was formed by method of Cascade Crystallization Process to serve as the electron transport layer. This layer formed the Schottky contact with the ITO electrode. The thickness of the electron transport layer of compound (XIXa) was 0.3 μm. Finally, a thin film of indium was deposited onto the electron transport layer to form the ohmic contact at a deposition rate of 1 Å/sec to a total thickness of 0.5 nm. This completed the preparation of an organic semiconductor diode with the Schottky contact.

Figure 3:
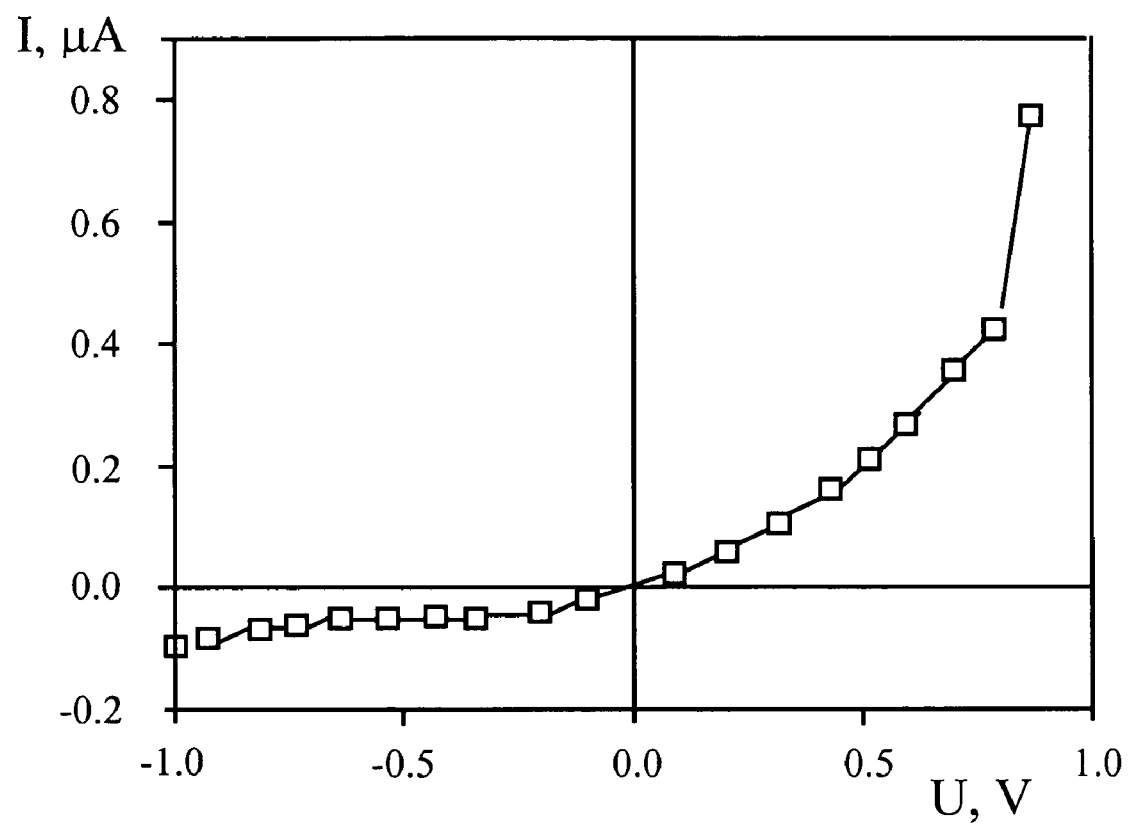
FIG. 3 shows the typical current-voltage characteristic of an organic semiconductor diode with the Schottky contact.

FIG. 3 shows the current-voltage characteristic of an Schottky barrier diode based on a perylene sulfoderivative with the formula (XIXa). The forward bias direction corresponded to plus on the ITO and minus on the indium (In) contact. As can be seen from FIG. 3, the Schottky barrier diode has a nonlinear current-voltage characteristic.

The preceding description is illustrative rather than limiting. Other embodiments and modifications may be readily apparent to those skilled in the art. All such embodiments and modifications should be considered part of the inventions and within the scope of the appended claims and any equivalents thereto.

What is claimed is:

1. An organic semiconductor diode with p-n junction comprising:
a first electrode;
a first organic semiconductor layer made of hole transport material and coupled to the first electrode;
a second organic semiconductor layer made of electron transport material and being in contact with the first layer at said junction, at least one of the hole or electron transport materials characterized by a globally ordered crystalline structure with intermolecular spacing of 3.4±0.3 ø in the direction of one crystal axis and is formed by rodlike supramolecules comprising at least one polycyclic organic compound with conjugated π-system; and
a second electrode coupled to the second layer such that the first and second electrodes are positioned to generate an electric field at the junction.

2. The organic semiconductor diode according to claim 1, wherein said polycyclic organic compound comprises at least one component of the general structural formula $\{R\}\{F\}_n$, where R is a polycyclic organic compound with conjugated π-system, F are modifying functional groups, and n is the number of functional groups.

3. The organic semiconductor diode according to claim 2, wherein said polycyclic organic compound is a sulfoderivative of a perynone dye with the general structural formula from the group comprising structures I-XVII:

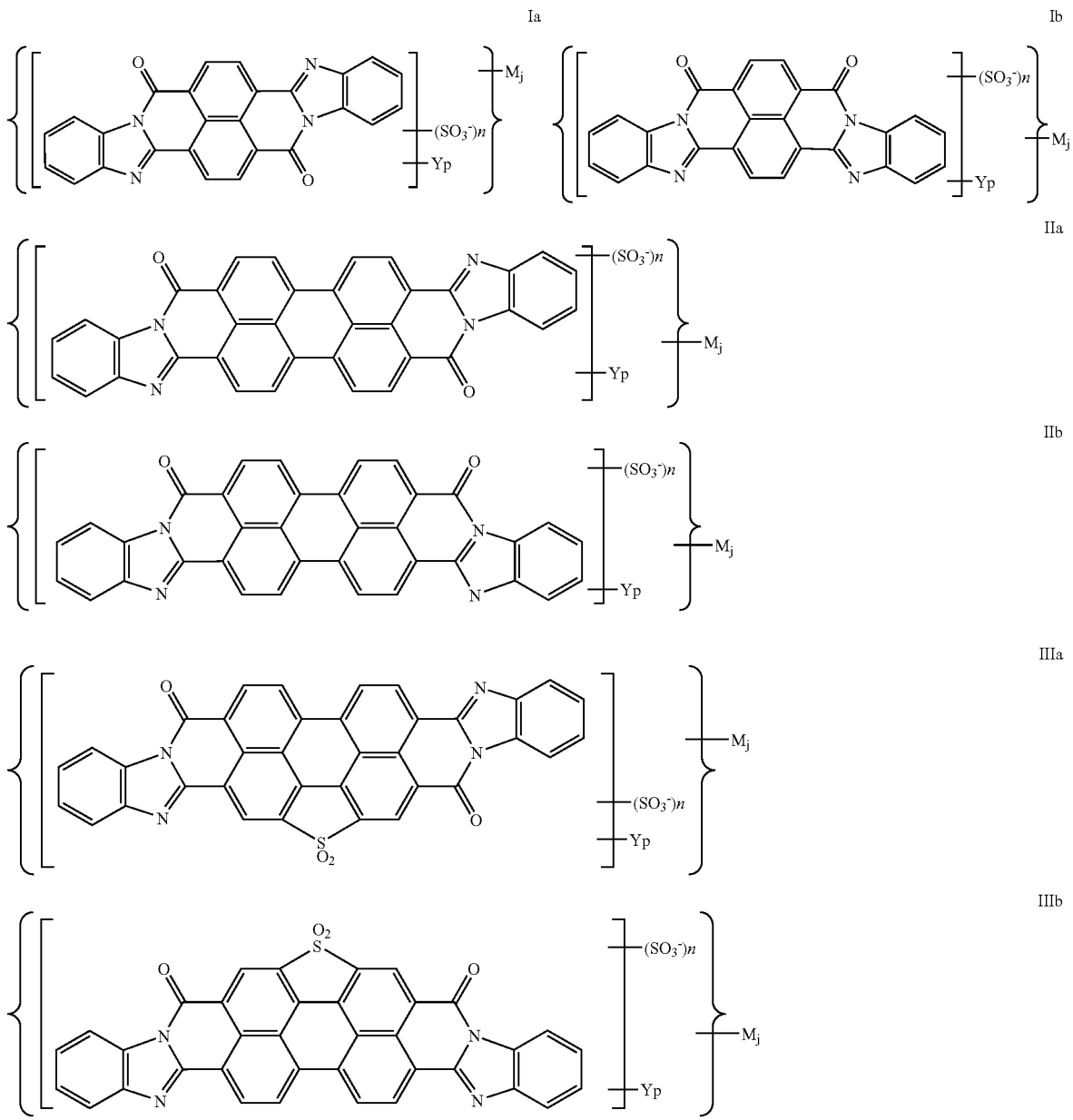

-continued
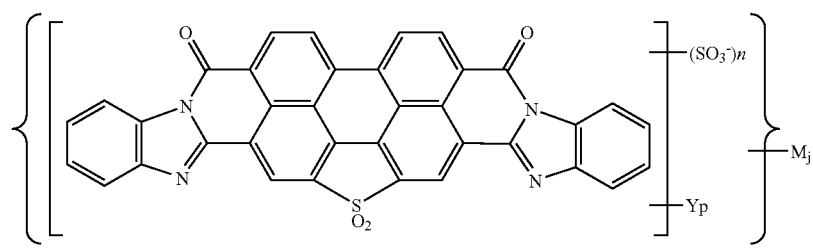
IVa
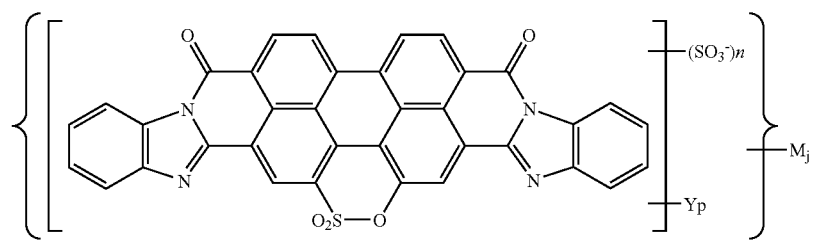
IVb
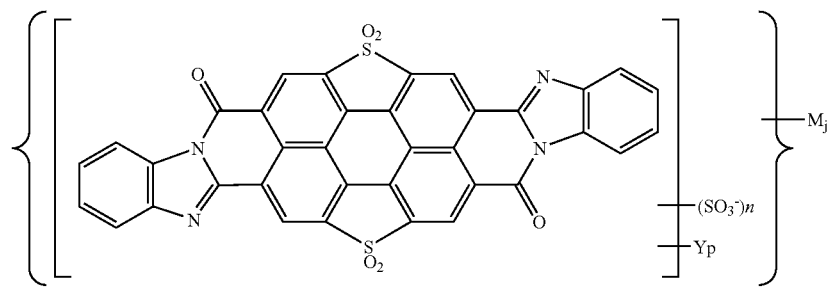
Va
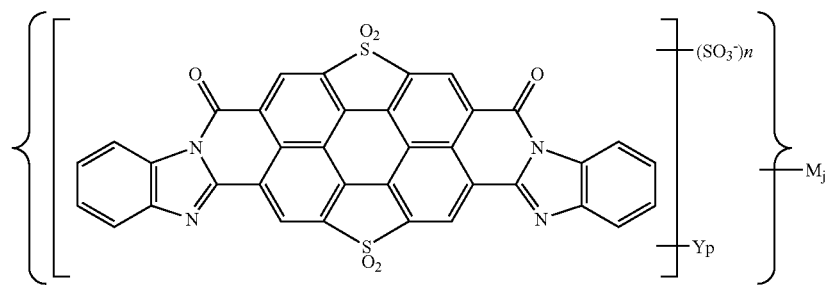
Vb
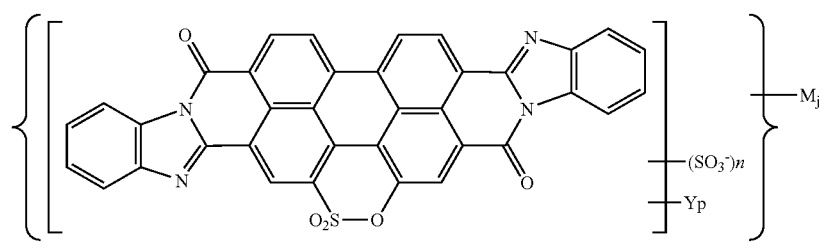
VIa
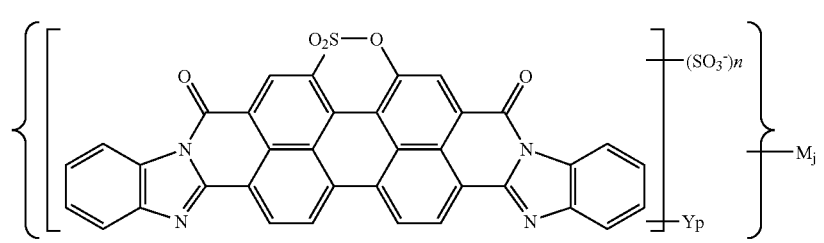
VIb

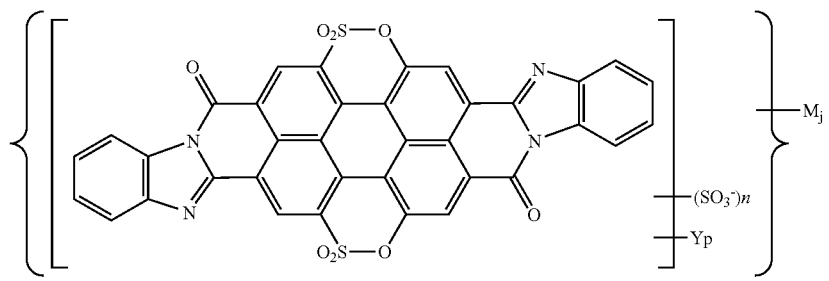
VIIa
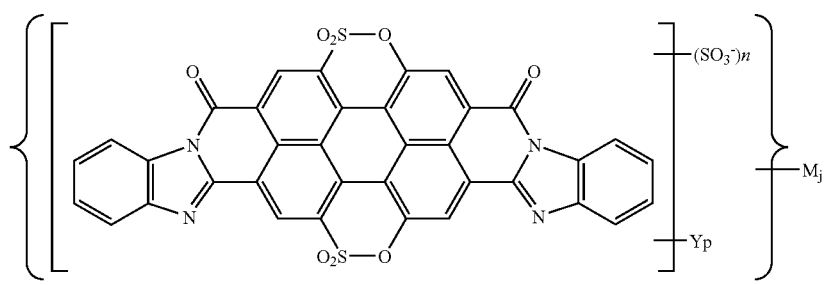
VIIb
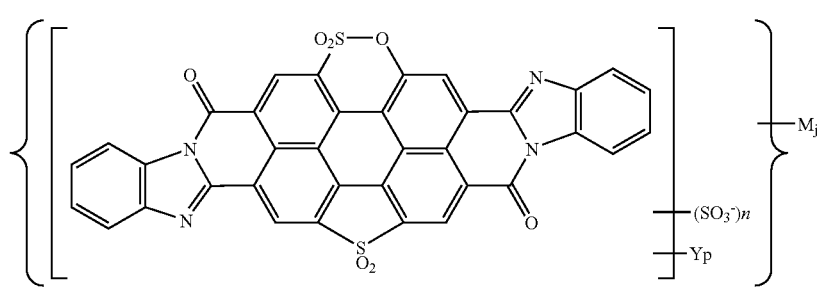
VIIIa
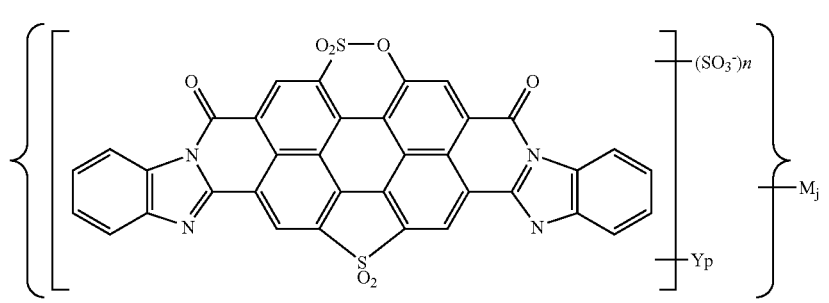
VIIIb
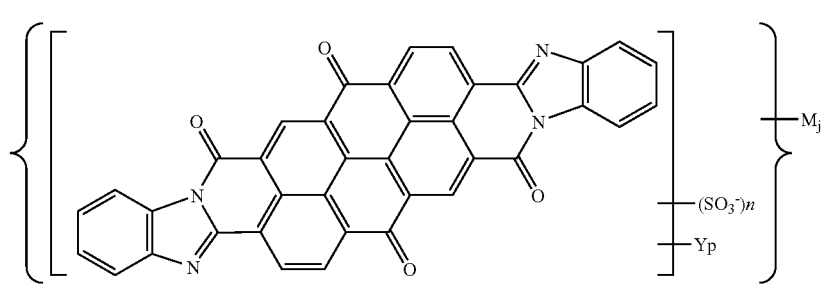
IXa -continued
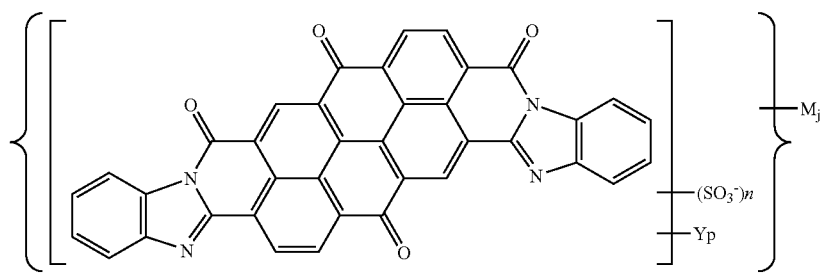
IXb
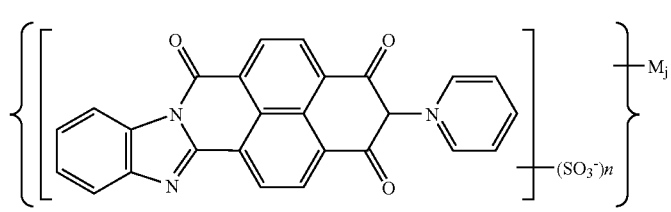
Xa
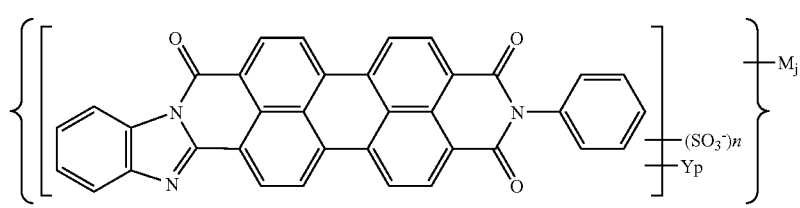
Xb
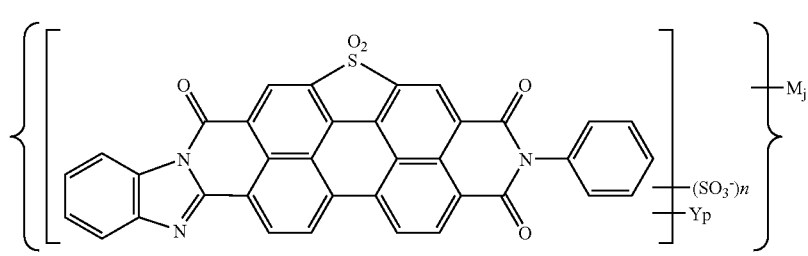
XIa
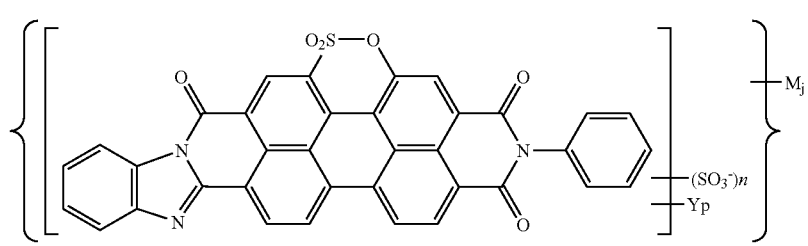
XIb
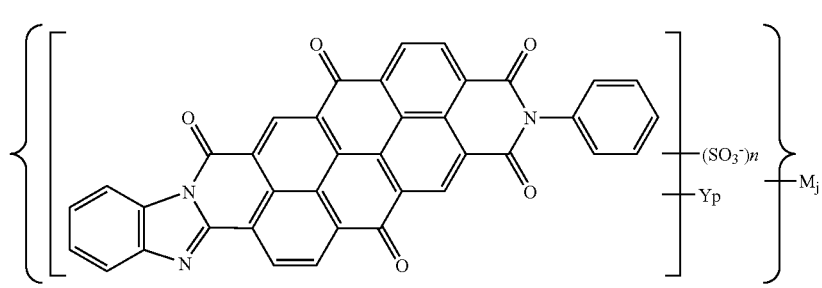
XII -continued

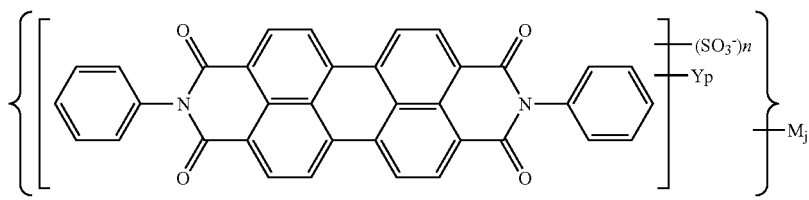
XIII

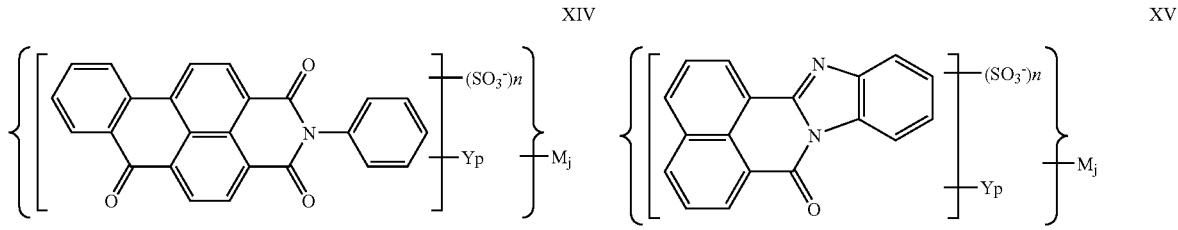
XIV    XV

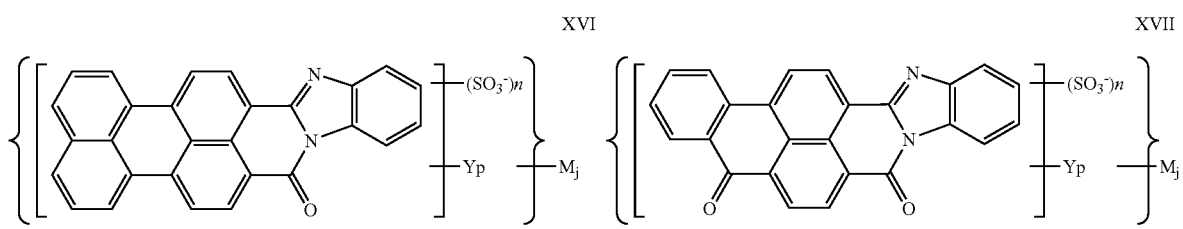
XVI    XVII where n is an integer in the range of 1 to 4 and p is an integer in the range of 0 to 6; Y is individually selected from the group consisting of H, Cl, F, Br, Alk, OH, OAlk, $NO_2$ and $NH_2$; M is a counterion; and j is the number of counterions in the molecule; for n>1, different counterions M can be involved.

4. The organic semiconductor diode according to claim 1, wherein said second electrode serving as cathode is made of a material with a low electron work function.

5. The organic semiconductor diode according to claim 4, wherein said cathode material is selected from the list comprising silver, lead, tin, aluminum, calcium, indium, chromium, an alkali metal such as magnesium or lithium, and an alloy of these metals such as Ca—Al, Mg—Ag and Li—Al, and an alkali metal compound, an alkaline-earth metal compound, or combinations thereof.

6. The organic semiconductor diode according to claim 1, wherein said first electrode serving as anode is made of a material with a high electron work function.

7. The organic semiconductor diode according to claim 6, wherein said anode material is selected from the group comprising nickel, gold, platinum, palladium, indium, ITO, iridium zinc oxide, zinc oxide, selenium, copper iodide, poly(3-methylthiophene), polyphenylene sulfide, and polyaniline, or combinations thereof.

8. The organic semiconductor diode according to claim 2, wherein said polycyclic organic compound is a sulfoderivative of a heteroaromatic polycycloquinone with the general structural formula from the group XVIIIa—XVIIId:

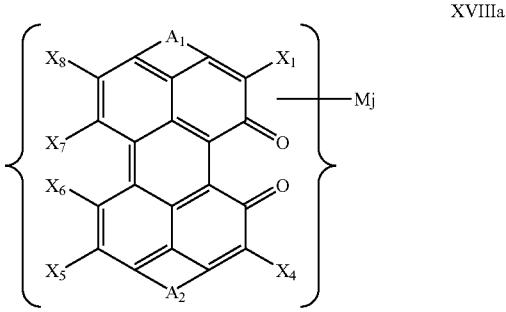
XVIIIa

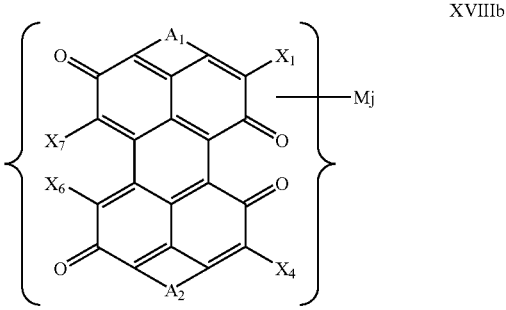
XVIIIb

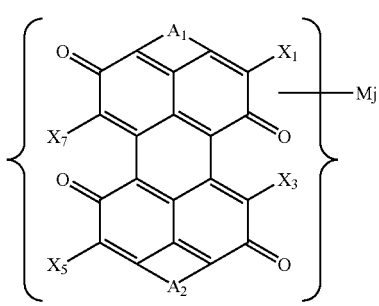

XVIIIc

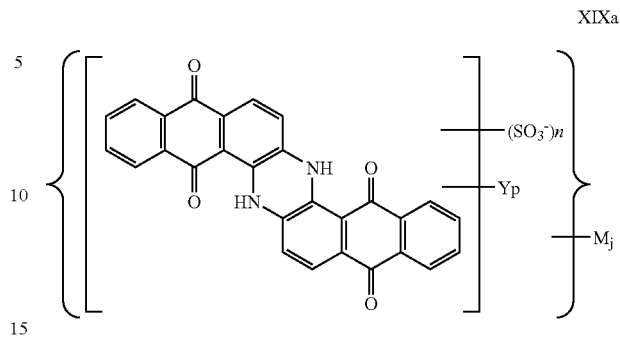

XIXa

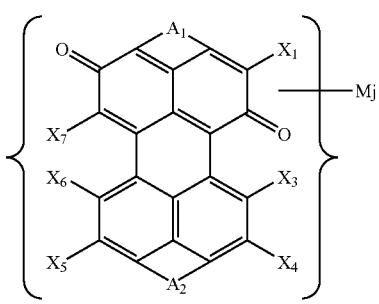

XVIIId

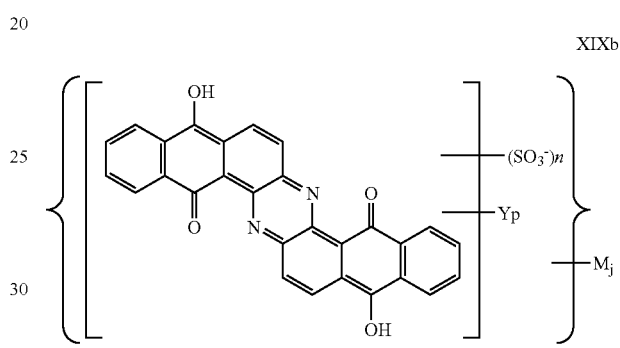

XIXb where $A_1$ и $A_2$ are fragments of the general structural formula

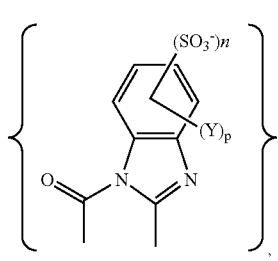

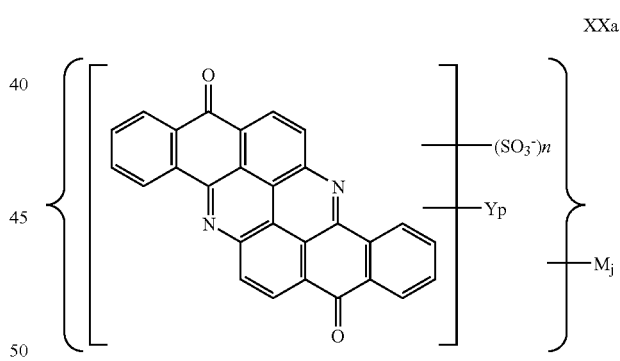

XXa $X_1$, $X_3$, $X_4$, $X_5$, $X_6$, $X_7$, $X_8$ are substituents from the group including H, OH, $SO_3H$, such that at least one of these substituents is different from H; Y is substituent from the series H, Cl, F, Br, Alk, OH, OAlk, $No_2$, $NH_2$; p is an integer in the range of 0, 1, 2, 3 and 4; n is one of the group including 0, 1, 2, such that at least one of fragments $A_1$ or $A_2$ comprises at least one sulfogroup; M is counterion; and j is the number of counterions in the molecule, which can be fractional if the counterion belongs to several molecules; for n>1, different counterions M can be involved.

9. The organic semiconductor diode according to claim 2, wherein the polycyclic organic compound is a sulfoderivative of dyes with fused anthraquinone fragment of the general structural formula from the group XIX—XXIII:

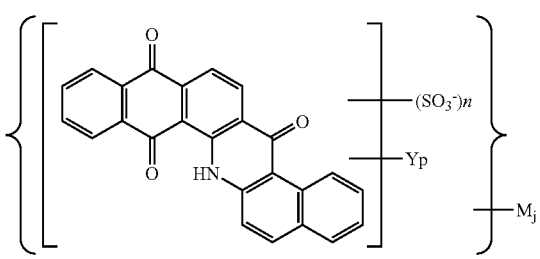

XXb

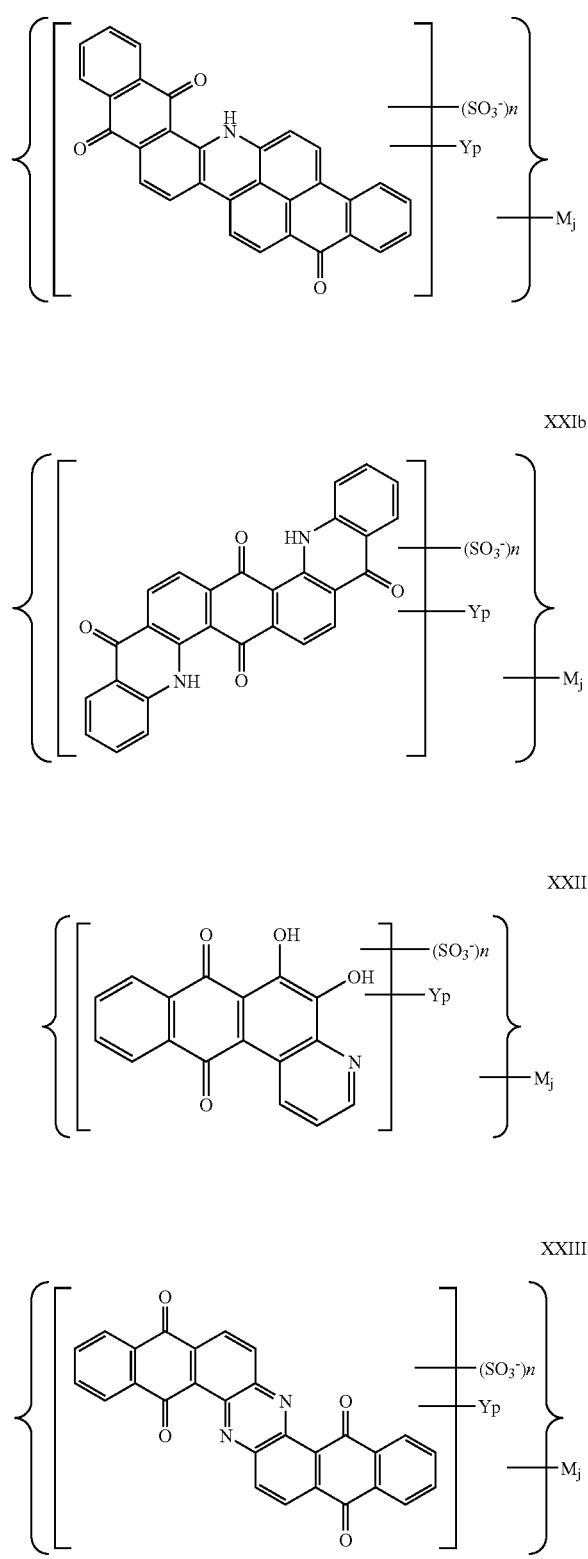

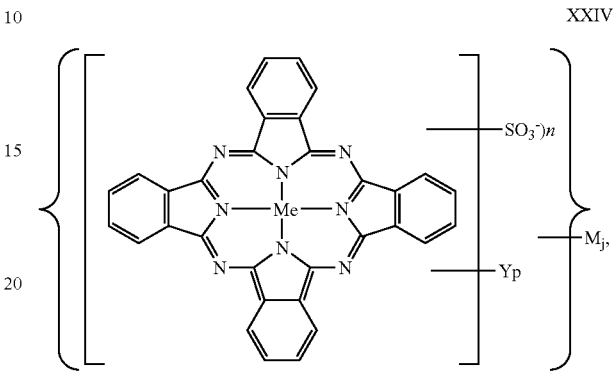

where n is an integer in the range of 1 to 4, and p is an integer in the range of 0 to 8; Y is individually selected from the group consisting of H, Cl, F, Br, Alk, OH, OAlk, NO₂ and NH₂; M is a counterion; and j is the number of counterions in the molecule; for n>1, different counterions M can be involved.

10. The organic semiconductor diode according to claim 2, wherein said polycyclic organic compound is a sulfo-derivative of phthalocianines of the general structural formula XXIV:

where n is an integer in the range of 1 to 4, and p is an integer in the range of 0 to 8; Y is individually selected from the group consisting of H, Cl, F, Br, Alk, OH, OAlk, NO₂ and NH₂; M is a counterion; and j is the number of counterions in the molecule; for n>1, different counterions M can be involved; Me is any metal.

11. A Schottky barrier diode comprising:
an organic semiconductor layer made of material characterized by a globally ordered crystalline structure with intermolecular spacing of 3.4±0.3 Å in the direction of one crystal axis and is formed by rodlike supramolecules comprising at least one polycyclic organic compound with conjugated π—system; and
a plurality of electrodes in contact with the organic semiconductor layer, wherein at least one of the plurality of electrodes forming a Schottky contact with the organic semiconductor layer.

12. The Schottky barrier diode according to claim 11, wherein at least one of the plurality of electrodes forming an ohmic contact with the organic semiconductor layer.

13. The Schottky barrier diode according to claim 12, wherein said organic semiconductor layer is made of an organic compound possessing the electron transport ability, at least one electrode possessing the Schottky contact is made of a material with a high electron work function, and at least one electrode possessing the ohmic contact is made of a material with a low electron work function.

14. The Schottky barrier diode according to claim 13, wherein said electrode with Schottky contact is made of material selected from the group comprising nickel, gold, platinum, palladium, ITO, iridium zinc oxide, zinc oxide, selenium, copper iodide, poly(3—methylthiophene), polyphenylene sulfide, and polyaniline, or combinations thereof.

15. The Schottky barrier diode according to claim 13, wherein said electrode with ohmic contact is made of material selected from the group comprising silver, lead, tin, aluminum, calcium, indium, chromium, an alkaline-earth metal such as magnesium or lithium, and an alloy of these metals such as Ca—Al, Mg—Ag, and Li—Al, and an alkali metal compound, and an alkaline-earth metal compound, or combinations thereof.

16. The Schottky barrier diode according to claim 12, wherein said organic semiconductor layer is made of an organic compound possessing the hole transport ability, at least one electrode possessing the ohmic contact is made of a material with a high electron work function, and at least one electrode possessing the Schottky contact is made of a material with a low electron work function.

17. The Schottky barrier diode according to claim 16, wherein said electrode with ohmic contact is made of electrode material selected from the group comprising nickel, gold, platinum, palladium, indium, ITO, iridium zinc oxide, zinc oxide, selenium, copper iodide, poly(3-methylthiophene), polyphenylene sulfide, and polyaniline, or combinations thereof.

18. The Schottky barrier diode according to claim 16, wherein said electrode with Schottky contact is made of electrode material selected from the group comprising silver, lead, tin, aluminum, calcium, indium, chromium, an alkaline—earth metal such as magnesium or lithium, and an alloy of these metals such as Ca—Al, Mg—Ag, and Li—Al, and an alkali metal compound, and an alkaline-earth metal compound, or combinations thereof.

19. The Schottky barrier diode according to claim 11, wherein said organic compound contains at least one component of the general structural formula $\{R\}\{F\}_n$, where R is a polycyclic organic compound with conjugated $\pi$-system, F are modifying functional groups, and n is the number of functional groups.

20. The Schottky barrier diode according to claim 19, wherein said polycyclic organic compound is a sulfoderivative of a perynone dye of the general structural formula from the group comprising structures I-XVII

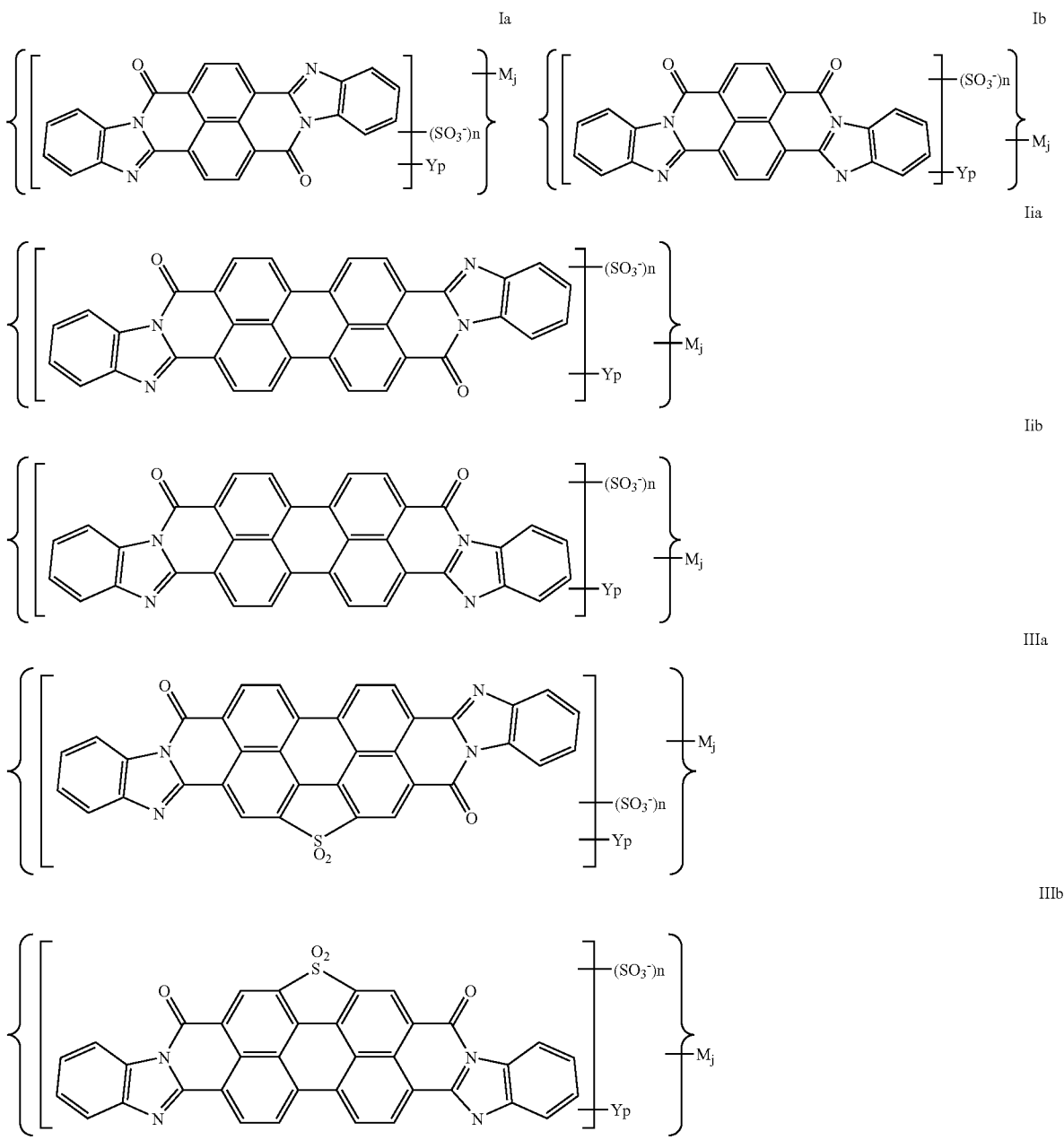

-continued
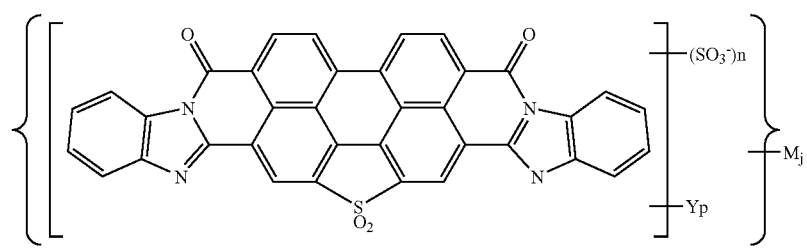
Iva
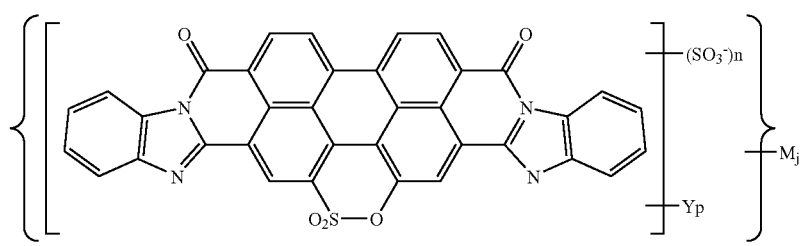
Ivb
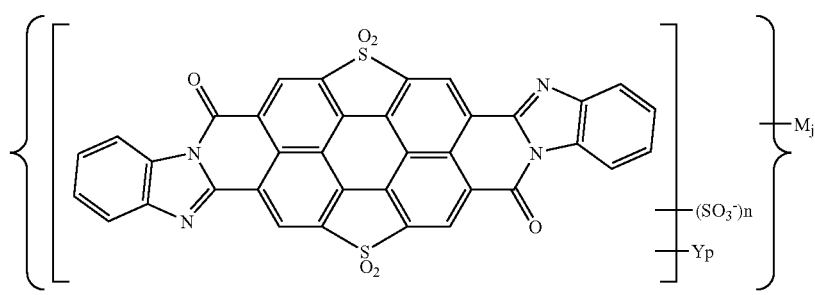
Va
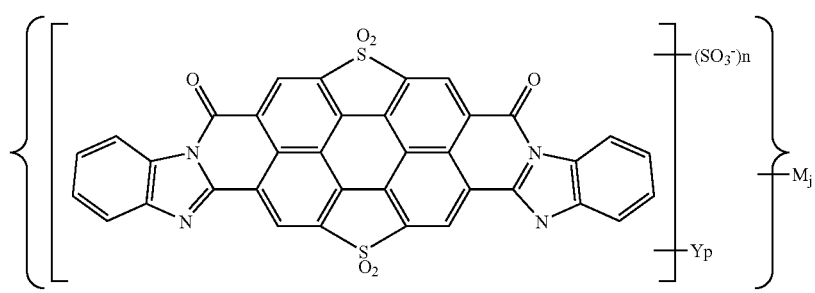
Vb
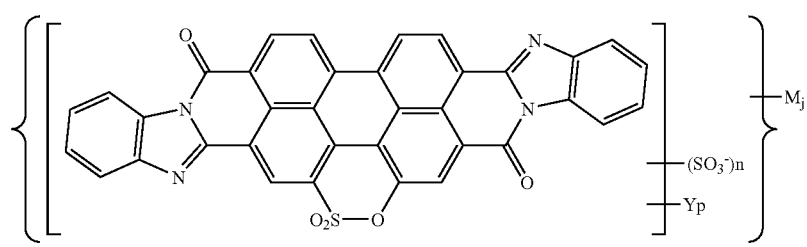
VIa -continued
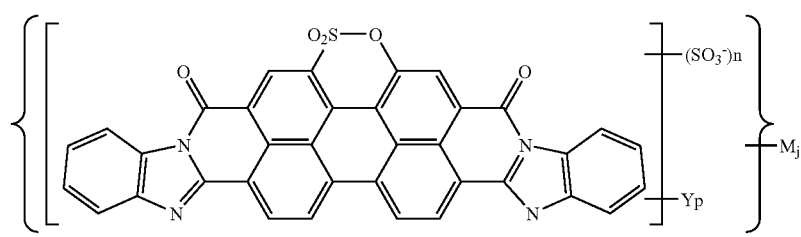
Vib
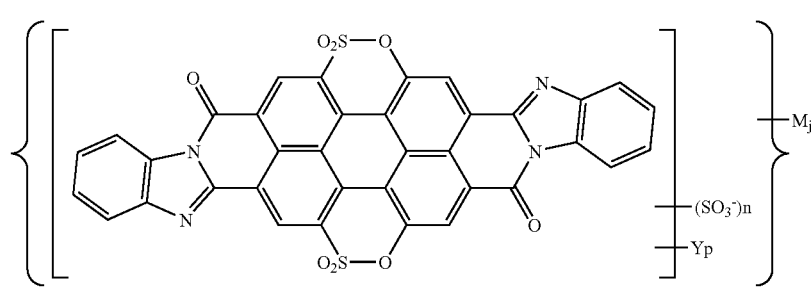
VIIa
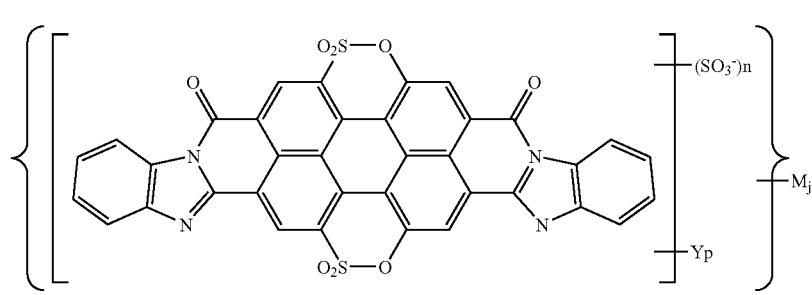
VIIb
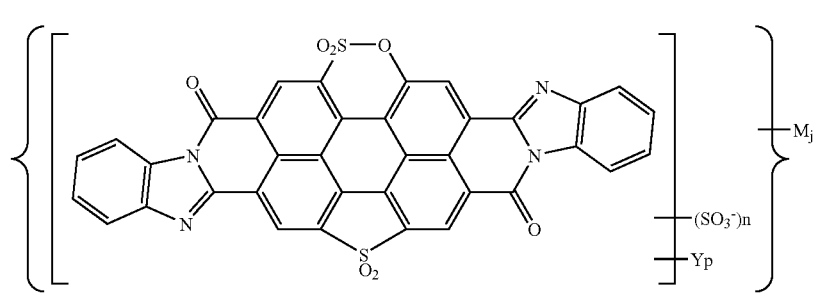
VIIIa
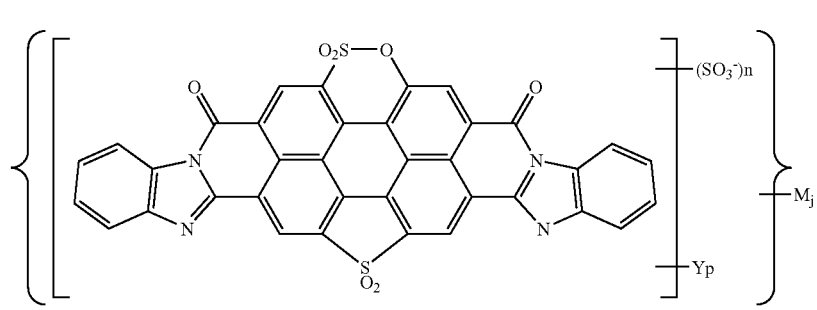
VIIIb -continued
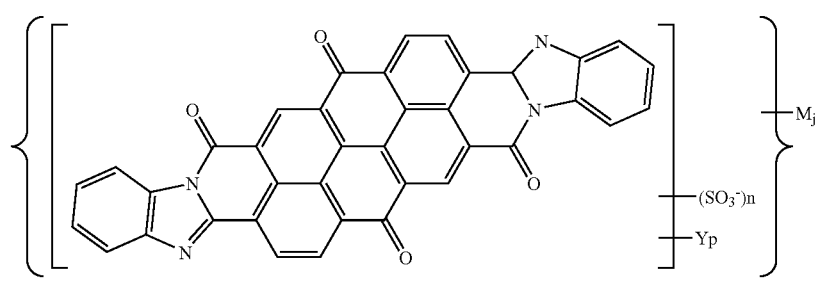
Ixa
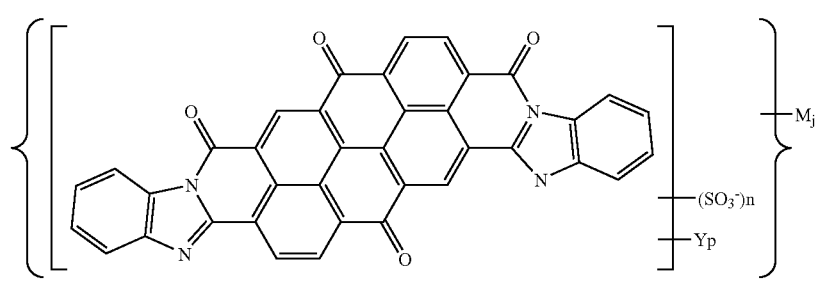
Ixb
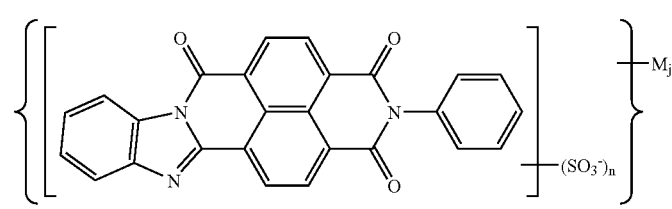
Xa
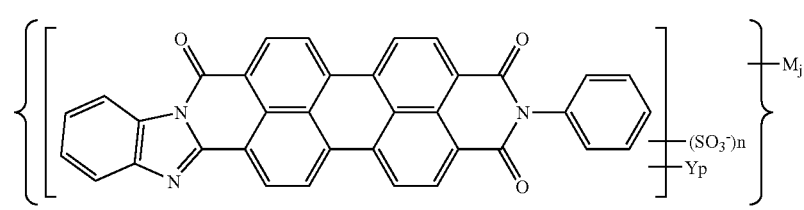
Xb
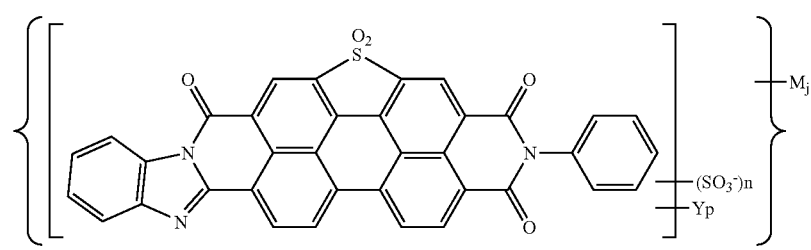
XIa
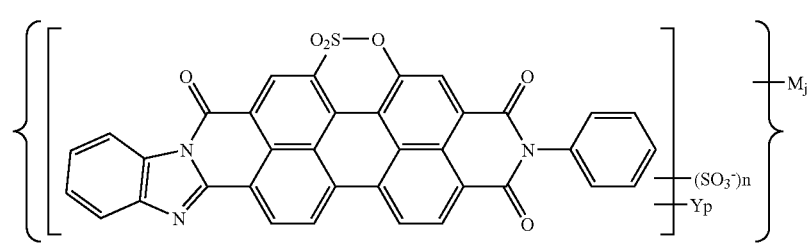
XIb

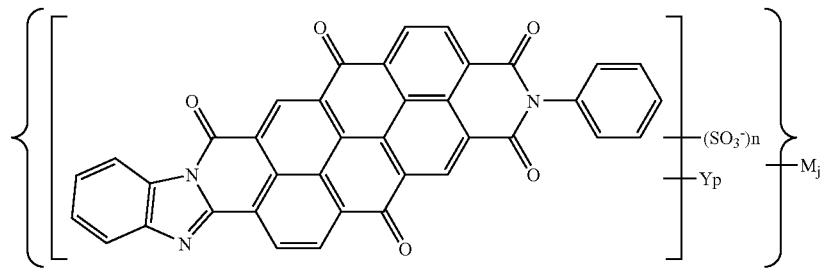

XII

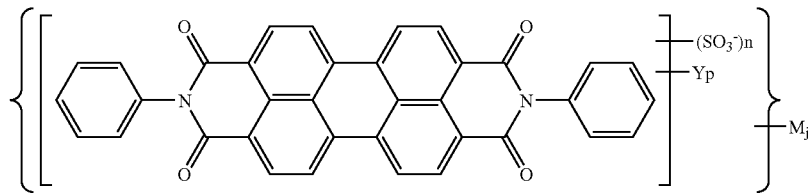

XIII

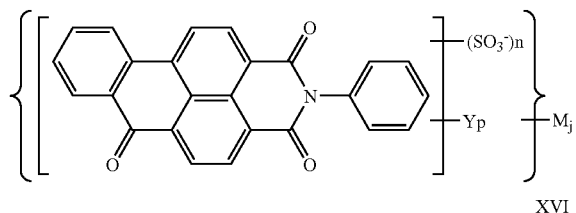

XIV

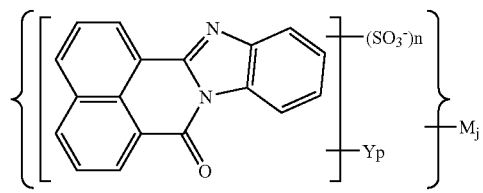

XV

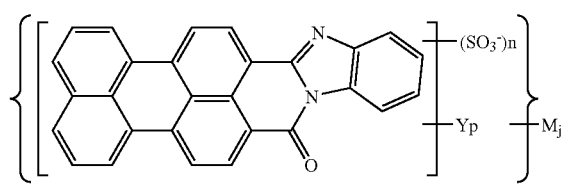

XVI

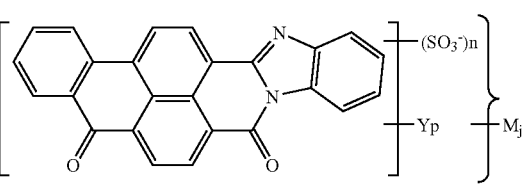

XVII where n is an integer in the range of 1 to 4, and p is an integer in the range of 0 to 6; Y is individually selected from the group consisting of H, Cl, F, Br, Alk, OH, OAlk, $NO_2$ and $NH_2$; M is a counterion; and j is the number of counterions in the molecule; for n>1, different counterions M can be involved.

21. The Schottky barrier diode according to claim 19, wherein said polycyclic organic compound is a sulfoderivative of a heteroaromatic polycycloquinone of the general structural formula from the group XVIIIa–XVIIId

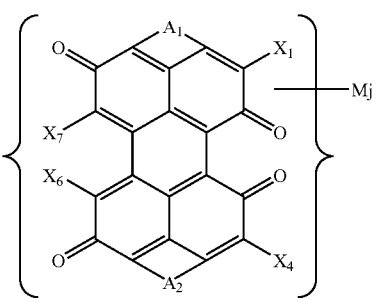

XVIIIb

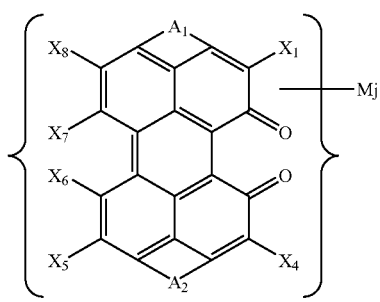

XVIIIa

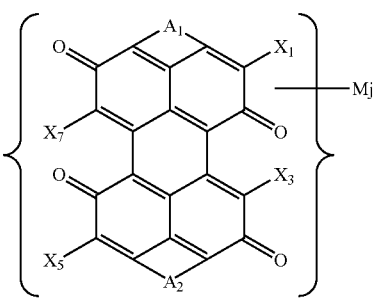

XVIIIc

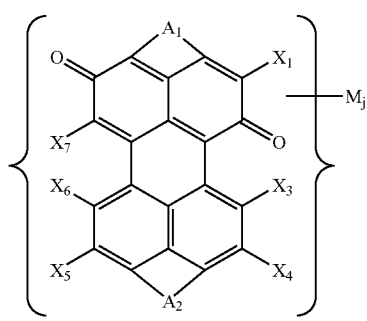

XVIII d where $A_1$ и $A_2$ are fragments of the general structural formula

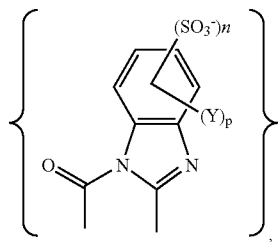

$X_1$, $X_3$, $X_4$, $X_5$, $X_6$, $X_7$, $X_8$ are substituents from the group including H, OH, $SO_3H$, such that at least one of these substituents is different from H; Y is a substituent from the series H, Cl, F, Br, Alk, OH, OAlk, $NO_2$, $NH_2$; p is an integer in the range of 0, 1, 2, 3 and 4; n is one of the group including 0, 1, 2, such that at least one of fragments $A_1$ or $A_2$ comprises at least one sulfogroup; M is counterion; and j is the number of counterions in the molecule, which can be fractional if the counterion belongs to several molecules; for n>1, different counterions M can be involved.

22. The Schottky barrier diode according to claim 19, wherein said polycyclic organic compound is a sulfoderivative of dyes with fused anthraquinone fragment of the general structural formula from the group XIX - XXIII

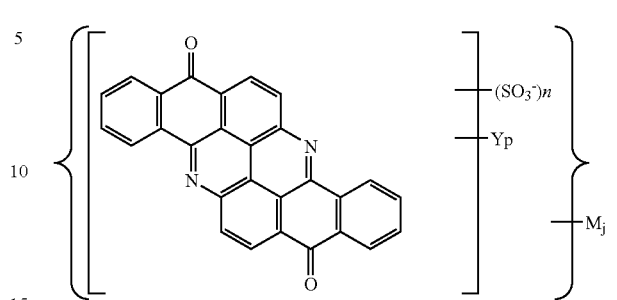

XXa

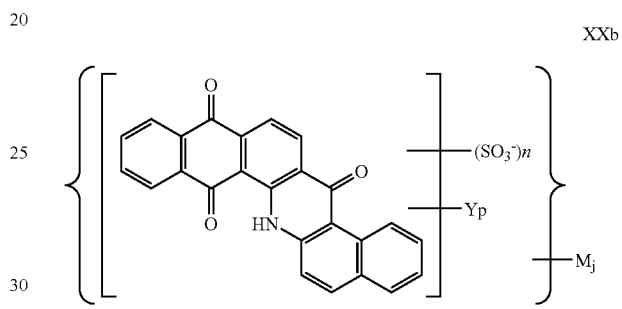

XXb

XIXa

XXIa

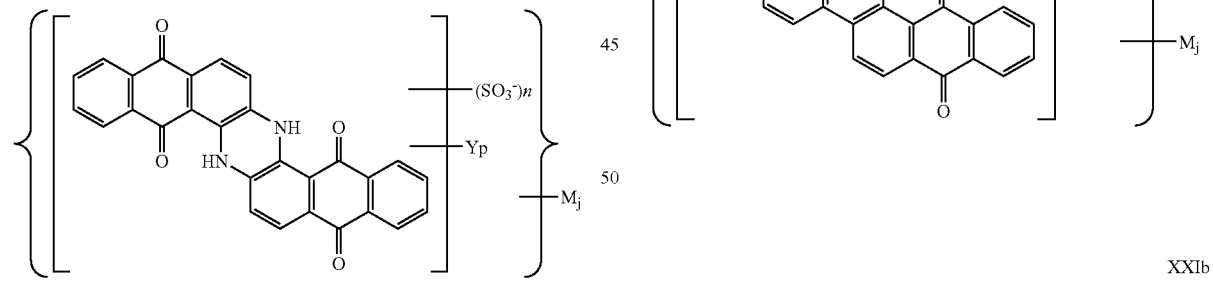

XIXb

XXIb

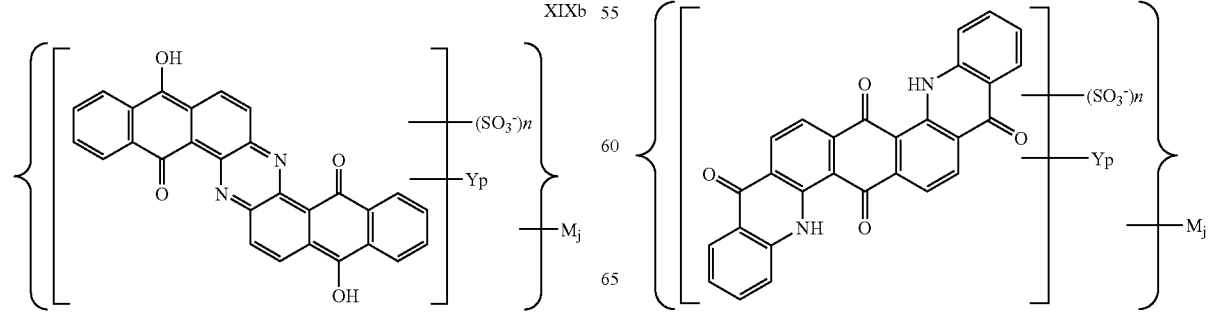

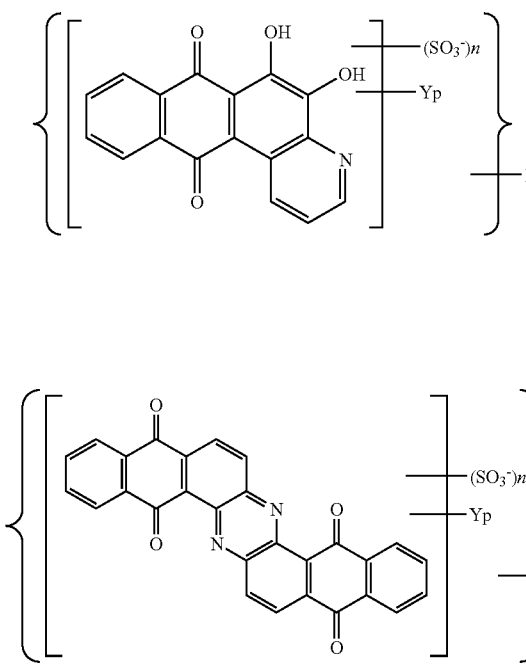

XXII

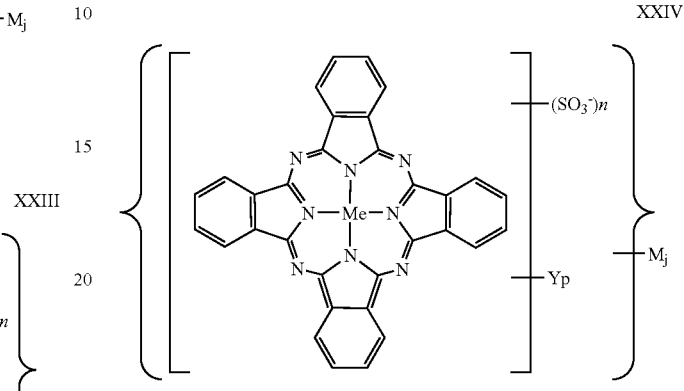

XXIV

NH$_2$; M is a counterion; and j is the number of counterions in the molecule; for n>1, different counterions M can be involved.

23. The Schottky barrier diode according to claim 19, wherein said polycyclic organic compound is a sulfoderivative of phthalocianines of the general structural formula XXIV where n is an integer in the range of 1 to 4, and p is an integer in the range of 0 to 8; Y is individually selected from the group consisting of H, Cl, F, Br, Alk, OH, OAlk, NO$_2$ and NH$_2$; M is a counterion; and j is the number of counterions in the molecule; for n>1, different counterions M can be involved; Me is any metal.

where n is an integer in the range of 1 to 4 and p is an integer in the range of 0 to 8; Y is individually selected from the group consisting of H, Cl, F, Br, Alk, OH, OAlk, NO$_2$ and

* * * * *